US012666561B2

(12) United States Patent
Ganti et al.

(10) Patent No.: US 12,666,561 B2
(45) Date of Patent: Jun. 23, 2026

(54) MEMS BASED COOLING SYSTEMS HAVING AN INTEGRATED SPOUT

(71) Applicant: Frore Systems Inc., San Jose, CA (US)

(72) Inventors: Suryaprakash Ganti, Los Altos, CA (US); Prabhu Sathyamurthy, San Jose, CA (US); Vikram Mukundan, San Ramon, CA (US); Sangkyu Kim, San Jose, CA (US); Prathima Kapa, Dublin, CA (US); Lizbeth Gomez, San Jose, CA (US); Brian James Gally, Los Gatos, CA (US)

(73) Assignee: Frore Systems Inc., San Jose, CA (US)

( * ) Notice: Subject to any disclaimer, the term of this patent is extended or adjusted under 35 U.S.C. 154(b) by 0 days.

(21) Appl. No.: 18/211,045

(22) Filed: Jun. 16, 2023

(65) Prior Publication Data

US 2023/0413471 A1 Dec. 21, 2023

Related U.S. Application Data

(60) Provisional application No. 63/353,490, filed on Jun. 17, 2022.

(51) Int. Cl.
| | |
|---|---|
| *H05K 7/20* | (2006.01) |
| *F28F 13/10* | (2006.01) |
| *G06F 1/20* | (2006.01) |

(52) U.S. Cl.
CPC ......... *H05K 7/20145* (2013.01); *F28F 13/10* (2013.01); *G06F 1/20* (2013.01); *H05K 7/20154* (2013.01); *H05K 7/20163* (2013.01)

(58) Field of Classification Search
CPC .. H05K 7/20145; H05K 7/20163; F28F 13/10
See application file for complete search history.

(56) References Cited

U.S. PATENT DOCUMENTS

| | | | | | |
|---|---|---|---|---|---|
| 4,450,505 | A | * | 5/1984 | Mittal | H05K 7/20454 257/E23.091 |
| 4,953,634 | A | * | 9/1990 | Nelson | H01L 23/473 257/E23.098 |
| 5,002,123 | A | * | 3/1991 | Nelson | F28F 13/08 257/E23.098 |
| 5,072,787 | A | * | 12/1991 | Nakamichi | H01L 23/467 165/146 |
| 5,388,635 | A | * | 2/1995 | Gruber | F28F 3/12 257/E23.09 |

(Continued)

FOREIGN PATENT DOCUMENTS

| | | | | |
|---|---|---|---|---|
| CN | 111463179 A | * | 7/2020 | H01L 21/4882 |

OTHER PUBLICATIONS

Translation of CN111463179A named Translation-CN111463179A (Year: 2020).*

*Primary Examiner* — Paul Alvare

(74) *Attorney, Agent, or Firm* — Van Pelt, Yi & James LLP

(57) ABSTRACT

A heat transfer system including an active component and a dissipation region is described. The active component is configured to undergo vibrational motion. The active component transfers fluid from a high pressure region to an ambient pressure region via an egress. The active component also induces a pulsating pressure in the fluid. The pulsating pressure is dissipated in the dissipation region such that turbulence is reduced where the fluid is introduced to the ambient pressure region.

7 Claims, 13 Drawing Sheets

(56) References Cited

U.S. PATENT DOCUMENTS

| | | | | |
|---|---|---|---|---|
| 6,154,368 | A * | 11/2000 | Scofield | H01L 23/467 |
| | | | | 257/E23.099 |
| 6,364,009 | B1 * | 4/2002 | MacManus | H01L 23/367 |
| | | | | 174/16.3 |
| 6,400,012 | B1 * | 6/2002 | Miller | H05K 7/20254 |
| | | | | 257/E23.098 |
| 6,650,542 | B1 * | 11/2003 | Chrysler | H01L 23/4735 |
| | | | | 174/15.1 |
| 7,282,837 | B2 | 10/2007 | Scher | |
| 7,283,365 | B2 * | 10/2007 | Craft, Jr. | H05K 7/20136 |
| | | | | 361/691 |
| 7,367,385 | B1 * | 5/2008 | Materna | F28F 13/08 |
| | | | | 165/146 |
| 7,420,807 | B2 * | 9/2008 | Mikubo | G06F 1/20 |
| | | | | 361/698 |
| 7,909,087 | B2 * | 3/2011 | Kimura | F28F 3/02 |
| | | | | 165/80.3 |
| 8,347,952 | B2 * | 1/2013 | Ali | G06F 1/203 |
| | | | | 165/122 |
| 8,934,240 | B2 * | 1/2015 | Yu | H01L 23/467 |
| | | | | 361/694 |
| 9,414,525 | B2 * | 8/2016 | Campbell | H05K 7/20772 |
| 9,575,524 | B1 * | 2/2017 | Prather | G06F 1/1662 |
| 10,018,430 | B2 * | 7/2018 | Kandlikar | F28F 13/08 |
| 10,364,910 | B2 * | 7/2019 | Han | F04B 43/0054 |
| 10,837,655 | B2 * | 11/2020 | Kwon | F24F 1/0018 |
| 10,871,156 | B2 * | 12/2020 | Tanaka | F04B 53/102 |
| 10,973,149 | B2 * | 4/2021 | Chen | H05K 7/20145 |
| 10,986,751 | B1 * | 4/2021 | Chen | H05K 7/20172 |
| 2004/0020231 | A1 * | 2/2004 | Nakamura | B60L 15/007 |
| | | | | 257/E23.098 |
| 2005/0089415 | A1 | 4/2005 | Cho | |
| 2005/0225213 | A1 | 10/2005 | Richards | |
| 2006/0147324 | A1 * | 7/2006 | Tanner | F04B 43/046 |
| | | | | 417/411 |
| 2008/0304979 | A1 | 12/2008 | Lucas | |
| 2009/0050294 | A1 * | 2/2009 | Fedorov | H01L 23/4735 |
| | | | | 165/80.3 |
| 2009/0226971 | A1 * | 9/2009 | Beer | B01L 3/502784 |
| | | | | 435/303.1 |
| 2009/0236083 | A1 * | 9/2009 | Brand | F28F 3/048 |
| | | | | 165/181 |
| 2011/0063800 | A1 * | 3/2011 | Park | H01L 23/467 |
| | | | | 361/697 |
| 2011/0168361 | A1 * | 7/2011 | Chao | H01L 23/467 |
| | | | | 417/413.2 |
| 2013/0071269 | A1 * | 3/2013 | Fujisaki | F04B 43/046 |
| | | | | 417/413.2 |
| 2013/0213730 | A1 | 8/2013 | Litovsky | |
| 2013/0301218 | A1 | 11/2013 | Li | |
| 2014/0379184 | A1 * | 12/2014 | Kim | F02N 15/022 |
| | | | | 180/65.265 |
| 2016/0025429 | A1 * | 1/2016 | Muir | F04B 45/047 |
| | | | | 318/116 |
| 2016/0076530 | A1 * | 3/2016 | Chen | F04B 45/047 |
| | | | | 417/413.2 |
| 2017/0188487 | A1 * | 6/2017 | Ambriz | H05K 7/20145 |
| 2018/0146544 | A1 | 5/2018 | Chen | |
| 2018/0146574 | A1 * | 5/2018 | Chen | H05K 7/20409 |
| 2018/0187672 | A1 * | 7/2018 | Tanaka | F04B 45/04 |
| 2019/0085836 | A1 * | 3/2019 | Mou | F04B 45/047 |
| 2019/0101938 | A1 * | 4/2019 | Mou | F04B 43/046 |
| 2019/0116689 | A1 * | 4/2019 | Chen | H05K 7/20154 |
| 2019/0309744 | A1 * | 10/2019 | Ting | F04B 45/047 |
| 2020/0053905 | A1 * | 2/2020 | Ganti | F04B 43/04 |
| 2020/0126892 | A1 * | 4/2020 | Mahjoob | F24S 40/55 |
| 2021/0131415 | A1 * | 5/2021 | Yalamarthy | F04B 49/00 |
| 2021/0176894 | A1 * | 6/2021 | Yalamarthy | G06F 1/20 |
| 2021/0176895 | A1 * | 6/2021 | Mukundan | H05K 7/20418 |
| 2021/0180723 | A1 * | 6/2021 | Mukundan | F04B 43/046 |
| 2021/0183739 | A1 * | 6/2021 | Sathyamurthy | H01L 23/46 |
| 2021/0185856 | A1 * | 6/2021 | Ganti | H05K 5/03 |
| 2022/0081284 | A1 * | 3/2022 | Ganti | B81B 7/0093 |
| 2022/0087058 | A1 * | 3/2022 | Sankar | H05K 7/20172 |
| 2022/0087064 | A1 * | 3/2022 | Ganti | F04B 45/047 |
| 2022/0187033 | A1 * | 6/2022 | Sankar | F28F 13/12 |
| 2022/0189852 | A1 * | 6/2022 | Sathyamurthy | F04D 33/00 |
| 2022/0232728 | A1 * | 7/2022 | Mahjoob | H05K 7/20163 |
| 2022/0282932 | A1 * | 9/2022 | Sathyamurthy | F28D 9/0081 |

* cited by examiner

100
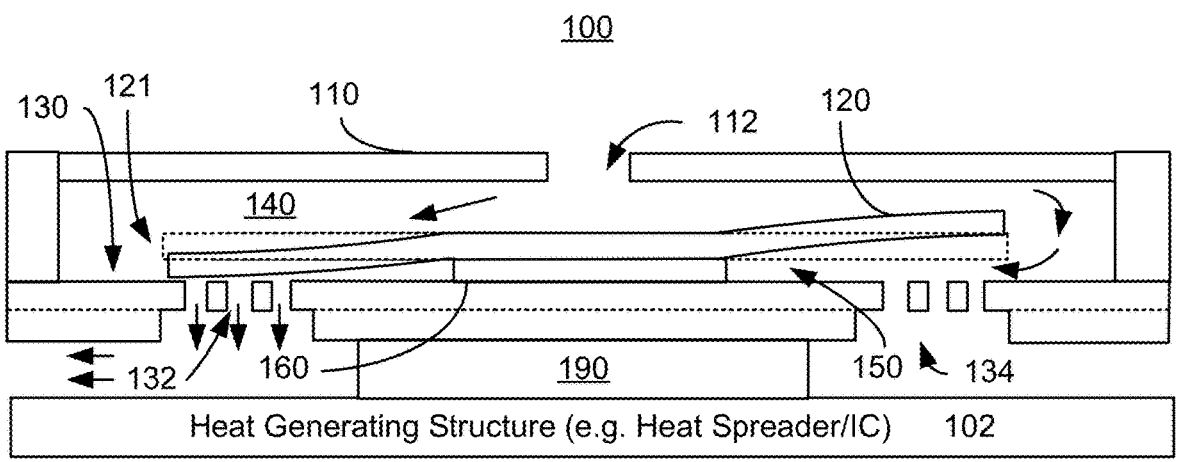
FIG. 1E
100
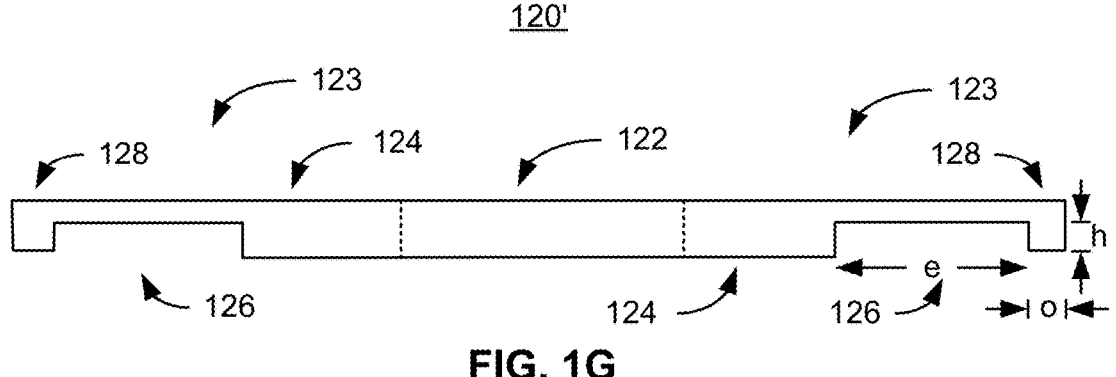
FIG. 1F
120'
Heat Generating Structure (e.g. Heat Spreader/IC)   102
FIG. 1G

300

300

401B

401C

401D

980

984

981

982

988

1080A

1084

1081

1088

1082

1080B

1084

1081

1088B

1082

1200

Drive Cooling Element(s) at Frequency
Corresponding to Resonance — 1202

Measure Characteristic(s) of Cooling Cell(s) — 1204

Adjust Frequency and/or Input Voltage of Driving
Signal Such that Frequency Corresponds to
Resonant State of Cooling Element(s) — 1206

MEMS BASED COOLING SYSTEMS HAVING AN INTEGRATED SPOUT

CROSS REFERENCE TO OTHER APPLICATIONS

This application claims priority to U.S. Provisional Patent Application No. 63/353,490 entitled MEMS VIBRA-TIONAL COOLING SYSTEM HAVING AN INTE-GRATED SPOUT AND A GRAPHITE COVER filed Jun. 17, 2022 which is incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Moreover, incorpo-rating cooling solutions into computing devices may be challenging. Consequently, additional cooling solutions for computing devices are desired.

BRIEF DESCRIPTION OF THE DRAWINGS

Various embodiments of the invention are disclosed in the following detailed description and the accompanying draw-ings.

FIGS. 1A-1G depict an embodiment of an active MEMS cooling system including a centrally anchored cooling ele-ment.

DETAILED DESCRIPTION

Figure 1A:
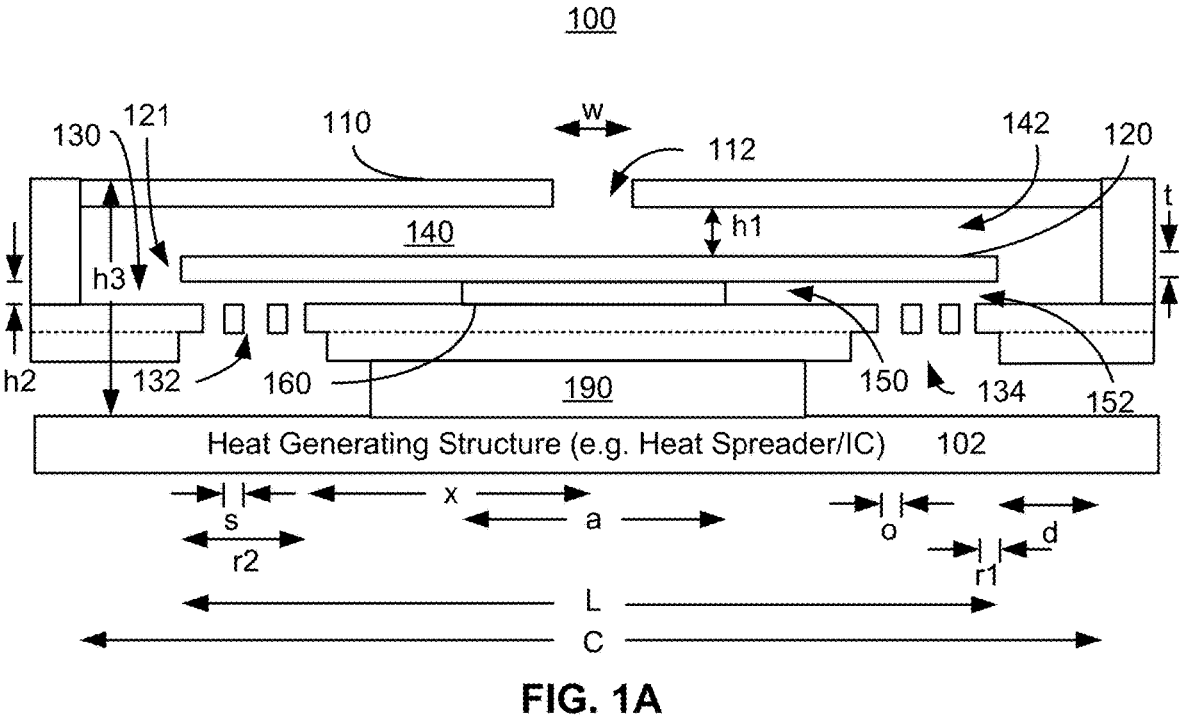

The invention can be implemented in numerous ways, including as a process; an apparatus; a system; a composi-tion of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as tech-niques. In general, the order of the steps of disclosed processes may be altered within the scope of the invention. Unless stated otherwise, a component such as a processor or a memory described as being configured to perform a task may be implemented as a general component that is tem-porarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying fig-ures that illustrate the principles of the invention. The invention is described in connection with such embodi-ments, but the invention is not limited to any embodiment. The scope of the invention is limited only by the claims and the invention encompasses numerous alternatives, modifi-cations and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smart-phones, tablet computers, notebook computers, and virtual reality devices as well as for other computing devices such as servers, can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated. Further, other components in a computing device may generate heat. Thus, thermal management is increasingly an issue for computing devices.

Larger computing devices, such as laptop computers, desktop computers, or servers, include active cooling sys-tems. Active cooling systems are those in which an electrical signal is used to drive cooling. An electric fan that has rotating blades is an example of an active cooling system, while a heat sink is an example of a passive cooling system. When energized, the fan's rotating blades drive air through the larger devices to cool internal components. However, space and other limitations in computing devices limit the use of active cooling systems. Fans are typically too large for mobile and/or thinner devices such as smartphones and tablet or notebook computers. Fans also may have limited efficacy because of the boundary layer of air existing at the surface of the components because they provide a limited airspeed for air flow across the hot surface desired to be cooled, and because they may generate an excessive amount of noise. Fans also have a limited backpressure. Space and power limitations may further restrict the ability to provide electrical connection to active cooling systems. For example, if multiple active cooling systems are used, the connections to the active cooling systems may be required to fit within a small area. In addition, the power consumed by such a cooling system may be desired to be small, particularly for mobile devices. Moreover, space limitations may adversely affect the ability to provide a sufficient flow for cooling computing devices. Consequently, active cooling systems face particular challenges when used in computing devices such as active computing devices. Passive cooling solutions may include components such as a heat spreader and a heat pipe or vapor chamber to transfer heat to a heat exchanger. However, passive cooling solutions may be unable to provide a sufficient amount of heat transfer to remove excessive heat generated. Thus, additional cooling solutions are desired.

A heat transfer system including an active component and a dissipation region is described. The active component is configured to undergo vibrational motion. The active component transfers fluid from a high pressure region to an ambient pressure region via an egress. The active component also induces a pulsating pressure in the fluid. The pulsating pressure is dissipated in the dissipation region such that turbulence is reduced where the fluid is introduced to an ambient pressure region. In some embodiments, the entrance of the dissipation region is exposed to the pulsating pressure, while the exit of the dissipation region substantially matches boundary conditions of the ambient pressure region. In some embodiments, the dissipation region has a length of at least one millimeter. In some such embodiments, the length of the dissipation region is at least two millimeters. In some embodiments, the exit of the dissipation region is nominally 7 millimeters (e.g. at least six millimeters and not more than eight millimeters) from the edge of the tile. There may be an inclined (tapered) portion and then a flat portion. The flat portion may be used to control the exit direction of the flow. In such an embodiment the flow exiting the dissipation region is desired to be substantially flat. For this type of flow a one millimeter or two millimeter flat region is desired.

In some embodiments, the heat transfer system also includes a chamber having an inlet and the egress. The active component is in the chamber. Further, the active component draws the fluid into the chamber through the inlet and drives the fluid out of the chamber through the egress via the vibrational motion. The fluid is transferred from the egress to the dissipation region. The chamber may be configured for an acoustic resonance of the fluid. The dissipation region may be formed by a spout coupled with chamber.

A channel region may be present between the egress of the chamber and the dissipation region. In some embodiments, the heat transfer system also includes a heat spreader coupled with the chamber. The channel region is between the heat spreader and the chamber. At least a portion of the dissipation region may be formed by a portion of the heat spreader. Thus, the spout may be integrated with the heat spreader. Integrating the dissipation region with the heat spreader aids in ensuring fluid exiting the system (e.g. the channel) does not dump the heat back into the system because the spout region will be at the same temperature as the spreader. In some embodiments, the dissipation region is coupled with the channel region such that the channel region and the dissipation region are tapered. The dissipation region has an entrance and an exit. In some embodiments, the entrance has an entrance fluid flow area, while the exit has an exit fluid flow area less than the entrance fluid flow area. Thus, the dissipation region (or spout) may be tapered. The dissipation region may have a height and a width. The height and/or the width may taper such that the exit fluid flow area is less than the entrance fluid flow area.

A fluid transfer system is described. The fluid transfer system includes fluid transfer cells, a channel region, and a dissipation region. The fluid transfer cells include chambers and a plurality of active components in the plurality of chambers. The active components are configured to undergo vibrational motion. The chambers have inlets and egresses, The active components draw fluid into the chambers, generate in the fluid a pulsating pressure including a high pressure greater than an ambient pressure, and drive the fluid out of the plurality of chambers via the plurality of egresses. The active components may use vibrational motion to perform these functions. The channel region is fluidically coupled with the egresses and receives the fluid having the pulsating pressure. The dissipation region is coupled with the channel region, receives the fluid from the channel region, and has an exit. The pulsating pressure is at least partially dissipated in the dissipation region. The fluid is introduced to a region having the ambient pressure at the exit of the dissipation region.

A method is described. The method includes activating an active component to undergo vibrational motion. The vibrational motion of the active component transfers fluid from a high pressure region to an ambient pressure region via an egress. The vibrational motion includes a pulsating pressure in the fluid. The fluid passes from the egress through a dissipation region in which the pulsating pressure is dissipated such that turbulence is reduced where the fluid is introduced to the ambient pressure region. In some embodiments, activating the active component includes driving the active component at a frequency corresponding to at least one of a fluidic resonance and a structural resonance of the active component.

The active component may reside in a chamber having an inlet and the egress. The active draws the fluid into the chamber through the inlet and drives the fluid out of the chamber through the egress. The fluid is transferred from the egress to the dissipation region. A channel region may reside between the egress of the chamber and the dissipation region. The dissipation region may be coupled with the channel region such that at least one of the channel region or the dissipation region are tapered. In some embodiments, a heat spreader coupled is coupled with the chamber. The channel region is between the heat spreader and the chamber. At least a portion of the dissipation region may be formed by a portion of the heat spreader. In some embodiments, the dissipation region is formed by a spout coupled with chamber. The dissipation region may have a length of at least one millimeter. In some embodiments, the length is at least two millimeters.

Figure 1B:
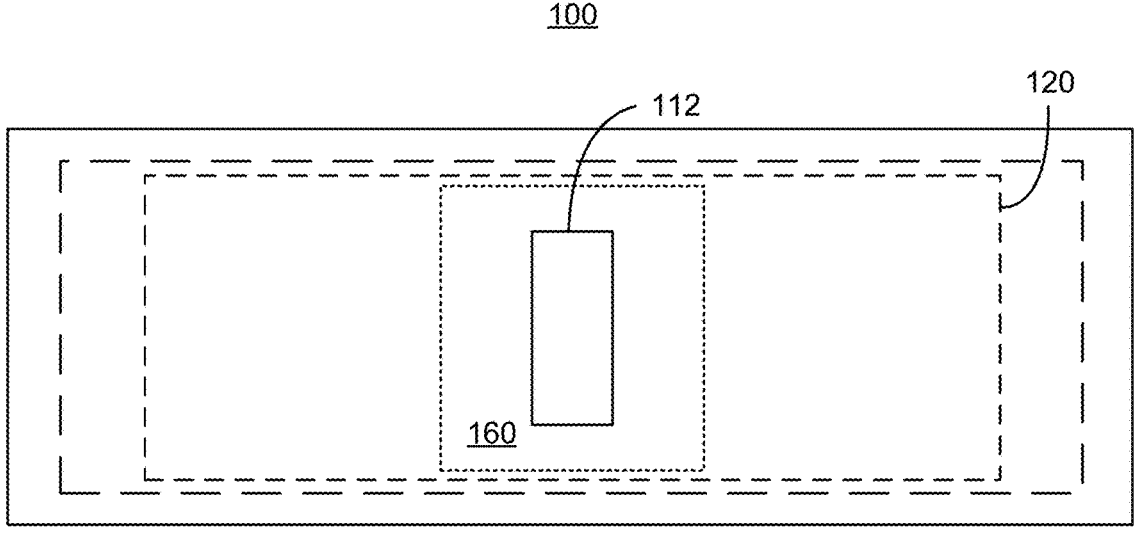
Figure 1C:
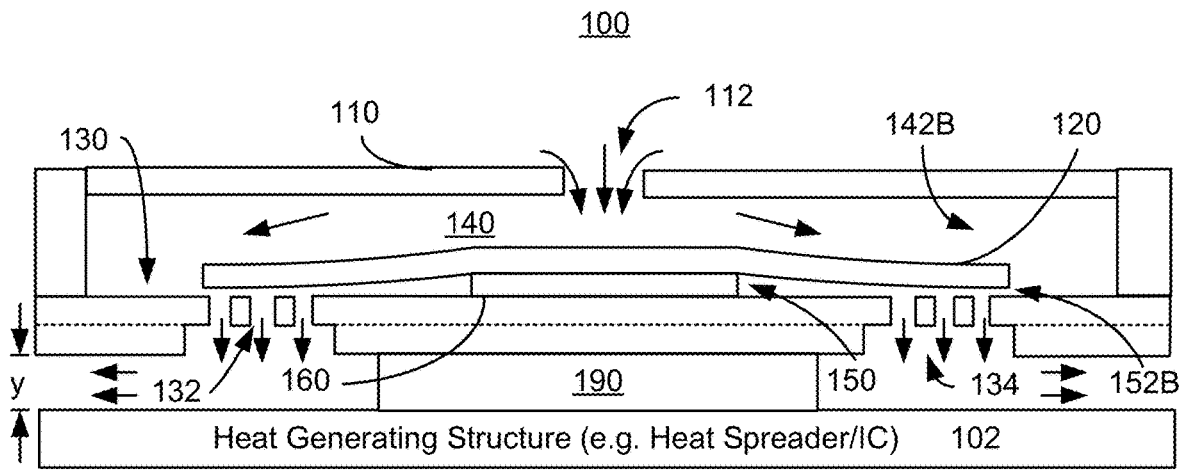
Figure 1D:
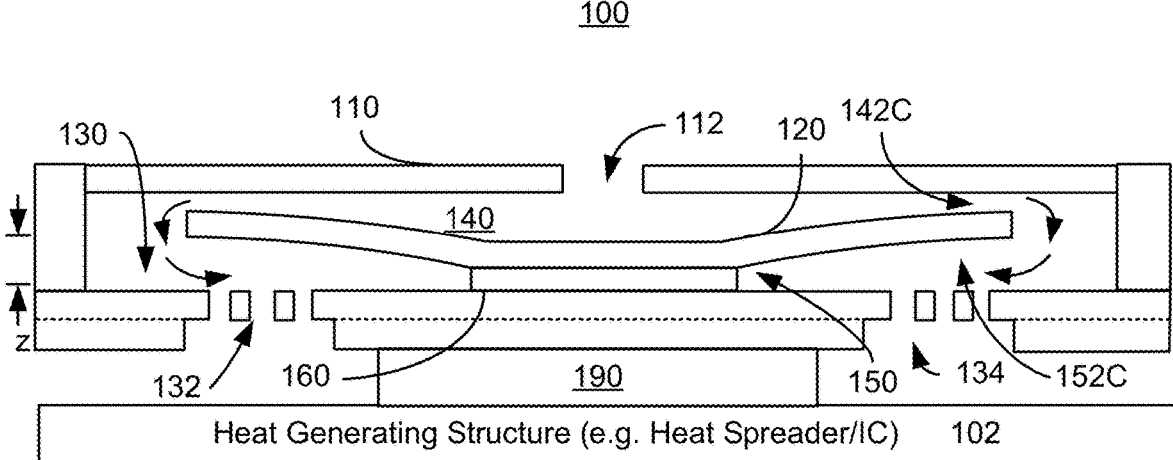

FIGS. 1A-1G are diagrams depicting an exemplary embodiment of active MEMS cooling system 100 usable with heat-generating structure 102 and including a centrally anchored cooling element 120 or 120'. Although termed a cooling system, MEMS system 100 and analogous systems described herein may be considered heat transfer systems and/or fluid transfer systems. Cooling element 120 is shown in FIGS. 1A-1F and cooling element 120' is shown in FIG. 1G. For clarity, only certain components are shown. FIGS. 1A-1G are not to scale. FIGS. 1A and 1B depict cross-sectional and top views of cooling system 100 in a neutral position. FIGS. 1C-1D depict cooling system 100 during actuation for in-phase vibrational motion. FIGS. 1E-1F depict cooling system 100 during actuation for out-of-phase vibrational motion. Although shown as symmetric, cooling system 100 need not be.

Cooling system 100 includes top plate 110 having vent 112 therein, cooling element 120, orifice plate 130 having orifices 132 and cavity 134 therein, support structure (or "anchor") 160 and chambers 140 and 150 (collectively chamber 140/150) formed therein. Cooling element 120 is supported at its central region by anchor 160. Although termed a cooling element with respect to FIGS. 1A-1G, cooling element 120 and analogous elements described herein may also be considered actuators, a vibrating elements, vibrating components, active components, and/or other terms indicating that the element is configured to undergo vibrational motion when activated (or energized) and/or to drive fluid through a system. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A. Also shown is pedestal 190 that connects orifice plate 130 to and offsets orifice plate 130 from heat-generating structure 102. In some embodiments, pedestal 190 also thermally couples orifice plate 130 to heat-generating structure 102. In some embodiments, an additional jet channel plate may be present and supported by pedestal 190. Thus orifice plate 130 and/or such a jet channel plate may be part or all of a bottom plate supported by pedestal 190. Thus, multiple plates and/or plate(s) having various structures may be used at the bottom plate for cooling system 100.

FIG. 1A depicts cooling system 100 in a neutral position. Thus, cooling element 120 is shown as substantially flat. For in-phase operation, cooling element 120 is driven to vibrate between positions shown in FIGS. 1C and 1D. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled. In some embodiments, heat-generating structure 102 may be a thermally conductive part of a module containing cooling system 100. For example, cooling system 100 may be affixed to heat-generating structure 102, which may be coupled to another heat sink, vapor chamber, integrated circuit, or other separate structure desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height, h3, of cooling system 100 (from the top of heat-generating structure 102 to the top of top plate 110) may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than 1.2 millimeter. For example, y may be at least two hundred and fifty micrometers and not more than three hundred micrometers. In some embodiments, y is at least five hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system 100 resides (e.g. in an enclosed device).

Cooling element 120 can be considered to divide the interior of active MEMS cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1F). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a seesaw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1F, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1F. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130. Thus, cooling element 120 may be viewed as an actuator. Although described in the context of a single, continuous cooling element, in some embodiments, cooling element 120 may be formed by two (or more) cooling elements. Each of the cooling elements is depicted as one portion pinned (e.g. supported by support structure 160) and an opposite portion unpinned. Thus, a single, centrally supported cooling element 120 may be formed by a combination of multiple cooling elements supported at an edge.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1F) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C, of chamber 140/150 is close to the length, L, of cooling element 120. For example, in some embodiments, the distance, d, between the edge of cooling element 120 and the wall of chamber 140/150 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, $C/2 = n\lambda/4$, where $\lambda$ is the acoustic wavelength for the fluid and n is odd (e.g. n=1, 3, 5, etc.). For the lowest order mode, $C = \lambda/2$. Because the length of chamber 140 (e.g. C) is close to the length of cooling element 120, in some embodiments, it is also approximately true that $L/2 = n\lambda/4$, where $\lambda$ is the acoustic wavelength for the fluid and n is odd. Thus, the frequency at which cooling element 120 is driven, v, is at or near the structural resonant frequency for cooling element 120. The frequency v is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency rather than to the acoustic resonant frequency.

Orifice plate 130 has orifices 132 and cavities 134 therein. Although a particular number and distribution of orifices 132 are shown, another number and/or another distribution may be used. Cavities 134 may be configured differently or may be omitted. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 130) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments, r1 is at least one hundred micrometers (e.g. $r1 \geq 100$ μm) and r2 is not more than one millimeter (e.g. $r2 \leq 1000$ μm). In some embodiments, orifices 132 are at least two hundred micrometers from tip 121 of cooling element 120 (e.g. $r1 \geq 200$ μm). In some such embodiments, orifices 132 are at least three hundred micrometers from tip 121 of cooling element 120 (e.g. $r1 \geq 300$ μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling elements though it is possible that a mechanism other than a piezoelectric might be used to drive the cooling element. In some embodiments, cooling element 120 includes a piezoelectric layer on substrate. The substrate may include or consist of stainless steel, a Ni alloy, Hastelloy, Al (e.g. an Al alloy), and/or Ti (e.g. a Ti alloy such as Ti6Al-4V). In some embodiments, a piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation, or other layers might be included in the piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Operation of cooling system 100 is described in the context of FIGS. 1A-1F. Although described in the context of particular pressures, gap sizes, and timing of flow, operation of cooling system 100 is not dependent upon the explanation herein. FIGS. 1C-1D depict in-phase operation of cooling system 100. Referring to FIG. 1C, cooling element 120 has been actuated so that its tip 121 moves away from top plate 110. FIG. 1C can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1C. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat-generating structure 102 is shown by unlabeled arrows in FIG. 1C.

Cooling element 120 is also actuated so that tip 121 moves away from heat-generating structure 102 and toward top plate 110. FIG. 1D can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1D. Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1D. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 150. Moreover, cooling system 100 may operate such that fluid is drawn in through vent 112 and driven out through orifices 132 without cooling element 120 contacting top plate 110 or orifice plate 130. Thus, pressures are developed within chambers 140 and 150 that effectively open and close vent 112 and orifices 132 such that fluid is driven through cooling system 100 as described herein.

The motion between the positions shown in FIGS. 1C and 1D is repeated. Thus, cooling element 120 undergoes vibrational motion indicated in FIGS. 1A-1D, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to the distal side of top plate 110 after cooling. In other embodiments, heated fluid is carried away and replaced by new fluid at the distal side of cooling element 120. As a result, heat-generating structure 102 may be cooled.

FIGS. 1E-1F depict an embodiment of active MEMS cooling system 100 including centrally anchored cooling element 120 in which the cooling element is driven out-of-phase. More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Movement of a section of cooling element 120 toward top plate 110 (an upstroke) drives fluid in top chamber 140 to bottom chamber 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. Because fluid is driven through orifices 132 at high speeds, cooling system 100 may be viewed as a MEMs jet. The movement of fluid is shown by unlabeled arrows in FIGS. 1E and 1F. The motion between the positions shown in FIGS. 1E and 1F is repeated. Thus, cooling element 120 undergoes vibrational motion indicated in FIGS. 1A, 1E, and 1F, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to the distal side of top plate 110 after cooling. In other embodiments, heated fluid is carried away and replaced by new fluid at the distal side of cooling element 120. As a result, heat-generating structure 102 may be cooled.

Although shown in the context of a uniform cooling element in FIGS. 1A-1F, cooling system 100 may utilize cooling elements having different shapes. FIG. 1G depicts an embodiment of engineered cooling element 120' having a tailored geometry and usable in a cooling system such as cooling system 100. Cooling element 120' includes an anchored region 122 and cantilevered arms 123. Anchored region 122 is supported (e.g. held in place) in cooling system 100 by anchor 160. Cantilevered arms 123 undergo vibrational motion in response to cooling element 120' being actuated. Each cantilevered arm 123 includes step region 124, extension region 126 and outer region 128. In the embodiment shown in FIG. 1G, anchored region 122 is centrally located. Step region 124 extends outward from anchored region 122. Extension region 126 extends outward from step region 124. Outer region 128 extends outward from extension region 126. In other embodiments, anchored region 122 may be at one edge of the actuator and outer region 128 at the opposing edge. In such embodiments, the actuator is edge anchored.

Extension region 126 has a thickness (extension thickness) that is less than the thickness of step region 124 (step thickness) and less than the thickness of outer region 128 (outer thickness). Thus, extension region 126 may be viewed as recessed. Extension region 126 may also be seen as providing a larger bottom chamber 150. In some embodiments, the outer thickness of outer region 128 is the same as the step thickness of step region 124. In some embodiments, the outer thickness of outer region 128 is different from the step thickness of step region 124. In some embodiments, outer region 128 and step region 124 each have a thickness of at least three hundred twenty micrometers and not more than three hundred and sixty micrometers. In some embodiments, the outer thickness is at least fifty micrometers and not more than two hundred micrometers thicker than the extension thickness. Stated differently, the step (difference in step thickness and extension thickness) is at least fifty micrometers and not more than two hundred micrometers. In some embodiments, the outer step (difference in outer thickness and extension thickness) is at least fifty micrometers and not more than two hundred micrometers. Outer region 128 may have a width, o, of at least one hundred micrometers and not more than three hundred micrometers. Extension region 126 has a length, e, extending outward from the step region of at least 0.5 millimeter and not more than 1.5 millimeters in some embodiments. In some embodiments, outer region 128 has a higher mass per unit length in the direction from anchored region 122 than extension region 126. This difference in mass may be due to the larger size of outer region 128, a difference in density between portions of cooling element 120, and/or another mechanism.

Use of engineered cooling element 120' may further improve efficiency of cooling system 100. Extension region 126 is thinner than step region 124 and outer region 128. This results in a cavity in the bottom of cooling element 120' corresponding to extension region 126. The presence of this cavity aids in improving the efficiency of cooling system 100. Each cantilevered arm 123 vibrates towards top plate 110 in an upstroke and away from top plate 110 in a downstroke. When a cantilevered arm 123 moves toward top plate 110, higher pressure fluid in top chamber 140 resists the motion of cantilevered arm 123. Furthermore, suction in bottom chamber 150 also resists the upward motion of cantilevered arm 123 during the upstroke. In the downstroke of cantilevered arm 123, increased pressure in the bottom chamber 150 and suction in top chamber 140 resist the downward motion of cantilevered arm 123. However, the presence of the cavity in cantilevered arm 123 corresponding to extension region 126 mitigates the suction in bottom chamber 150 during an upstroke. The cavity also reduces the increase in pressure in bottom chamber 150 during a downstroke. Because the suction and pressure increase are reduced in magnitude, cantilevered arms 123 may more readily move through the fluid. This may be achieved while substantially maintaining a higher pressure in top chamber 140, which drives the fluid flow through cooling system 100. Moreover, the presence of outer region 128 may improve the ability of cantilevered arm 123 to move through the fluid being driven through cooling system 100. Outer region 128 has a higher mass per unit length and thus a higher momentum. Consequently, outer region 128 may improve the ability of cantilevered arms 123 to move through the fluid being driven through cooling system 100. The magnitude of the deflection of cantilevered arm 123 may also be increased. These benefits may be achieved while maintaining the stiffness of cantilevered arms 123 through the use of thicker step region 124. Further, the larger thickness of outer region 128 may aid in pinching off flow at the bottom of a downstroke. Thus, the ability of cooling element 120' to provide a valve preventing backflow through orifices 132 may be improved. Thus, performance of cooling system 100 employing cooling element 120' may be improved.

Further, cooling elements used in cooling system 100 may have different structures and/or be mounted differently than depicted in FIGS. 1A-1G. In some embodiments, the cooling element may have rounded corners and/or rounded ends but still be anchored along a central axis such that cantilevered arms vibrate. The cooling element may be anchored only at its central region such that the regions surrounding the anchor vibrate in a manner analogous to a jellyfish or the opening/closing of an umbrella. In some such embodiments, the cooling element may be circular or elliptical in shape. In some embodiments, the anchor may include apertures through which fluid may flow. Such an anchor may be utilized for the cooling element being anchored at its top (e.g. to the top plate). Although not indicated in FIGS. 1A-1G, the piezoelectric utilized in driving the cooling element may have various locations and/or configurations. For example, the piezoelectric may be embedded in the cooling element, affixed to one side of the cooling element (or cantilevered arm(s)), may occupy some or all of the cantilevered arms, and/or may have a location that is close to or distal from the anchored region. In some embodiments, cooling elements that are not centrally anchored may be used. For example, a pair of cooling elements that have offset apertures, that are anchored at their ends (or all edges), and which vibrate out of phase may be used. Thus, various additional configurations of cooling element 120 and/or 120', anchor 160, and/or other portions of cooling system 100 may be used.

Using the cooling system 100 actuated for in-phase vibration or out-of-phase vibration of cooling element 120 and/or 120', fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120/120' may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120/120' does not physically contact top plate 110 or orifice plate 130 during vibration. Thus, resonance of cooling element 120/120' may be more readily maintained. More specifically, physical contact between cooling element 120/120' and other structures disturbs the resonance conditions for cooling element 120/120'. Disturbing these conditions may drive cooling element 120/120' out of resonance. Thus, additional power would need to be used to maintain actuation of cooling element 120/120'. Further, the flow of fluid driven by cooling element 120/120' may decrease. These issues are avoided through the use of pressure differentials and fluid flow as discussed above. The benefits of improved, quiet cooling may be achieved with limited additional power. Further, out-of-phase vibration of cooling element 120/120' allows the position of the center of mass of cooling element 120/120' to remain more stable. Although a torque is exerted on cooling element 120/120', the force due to the motion of the center of mass is reduced or eliminated. As a result, vibrations due to the motion of cooling element 120/120' may be reduced. Moreover, efficiency of cooling system 100 may be improved through the use of out-of-phase vibrational motion for the two sides of cooling element 120/120'. Consequently, performance of devices incorporating the cooling system 100 may be improved. Further, cooling system 100 may be usable in other applications (e.g. with or without heat-generating structure 102) in which high fluid flows and/or velocities are desired.

Figure 2A:
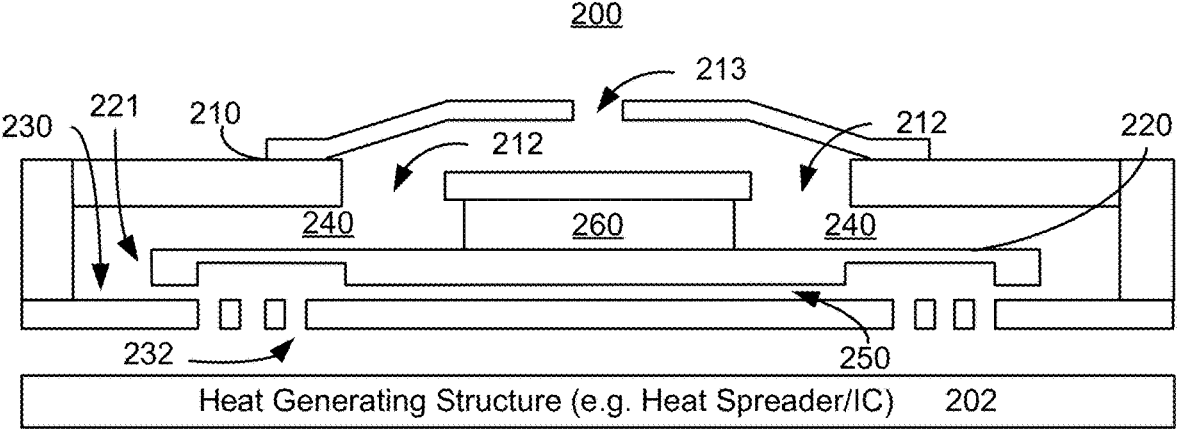
FIGS. 2A-2B depict an embodiment of an active MEMS cooling system including a centrally anchored cooling ele-ment.
Figure 2B:
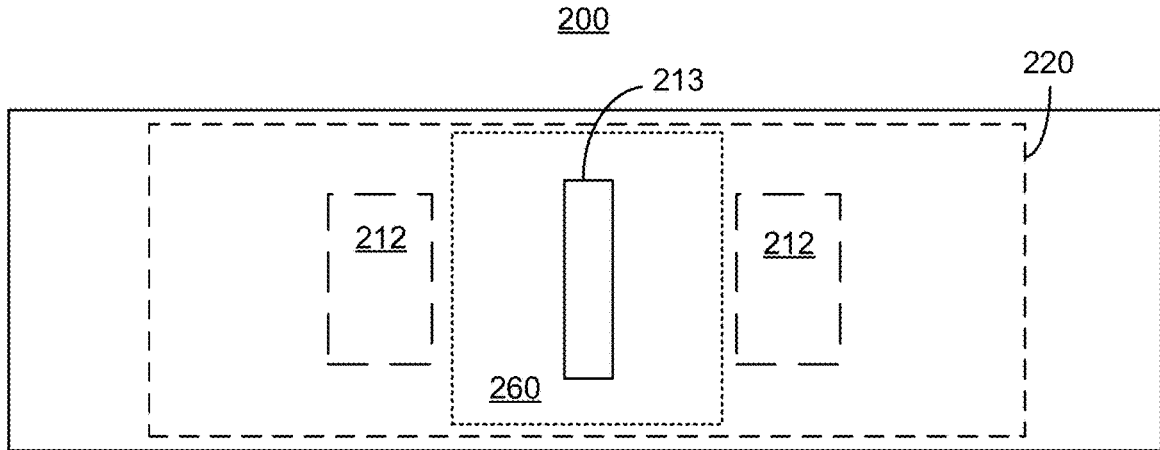

FIGS. 2A-2B depict an embodiment of active MEMS cooling system 200 including a top centrally anchored cooling element. FIG. 2A depicts a side view of cooling system 200 in a neutral position. FIG. 2B depicts a top view of cooling system 200. FIGS. 2A-2B are not to scale. For simplicity, only portions of cooling system 200 are shown. Referring to FIGS. 2A-2B, cooling system 200 is analogous to cooling system 100. Consequently, analogous components have similar labels. For example, cooling system 200 is used in conjunction with heat-generating structure 202, which is analogous to heat-generating structure 102.

Cooling system 200 includes top plate 210 having vents 212, cooling element 220 having tip 221, orifice plate 230 including orifices 232, top chamber 240 having a gap, bottom chamber 250 having a gap, flow chamber 240/250, and anchor (i.e. support structure) 260 that are analogous to top plate 110 having vent 112, cooling element 120 having tip 121, orifice plate 130 including orifices 132, top chamber 140 having gap 142, bottom chamber 150 having gap 152, flow chamber 140/150, and anchor (i.e. support structure) 160, respectively. Also shown is pedestal 290 that is analogous to pedestal 190. Thus, cooling element 220 is centrally supported by anchor 260 such that at least a portion of the perimeter of cooling element 220 is free to vibrate. In some embodiments, anchor 260 extends along the axis of cooling element 220. In other embodiments, anchor 260 is only near the center portion of cooling element 220. Although not explicitly labeled in FIGS. 2A and 2B, cooling element 220 includes an anchored region and cantilevered arms including step region, extension region, and outer regions analogous to anchored region 122, cantilevered arms 123, step region 124, extension region 126, and outer region 128 of cooling element 120'. In some embodiments, cantilevered arms of cooling element 220 are driven in-phase. In some embodiments, cantilevered arms of cooling element 220 are driven out-of-phase. In some embodiments, a simple cooling element, such as cooling element 120, may be used.

Anchor 260 supports cooling element 220 from above. Thus, cooling element 220 is suspended from anchor 260. Anchor 260 is suspended from top plate 210. Top plate 210 includes vent 213. Vents 212 on the sides of anchor 260 provide a path for fluid to flow into sides of chamber 240.

As discussed above with respect to cooling system 100, cooling element 220 may be driven to vibrate at or near the structural resonant frequency of cooling element 220. Further, the structural resonant frequency of cooling element 220 may be configured to align with the acoustic resonance of the chamber 240/250. The structural and acoustic resonant frequencies are generally chosen to be in the ultrasonic range. For example, the vibrational motion of cooling element 220 may be at the frequencies described with respect to cooling system 100. Consequently, efficiency and flow rate may be enhanced. However, other frequencies may be used.

Cooling system 200 operates in an analogous manner to cooling system 100. Cooling system 200 thus shares the benefits of cooling system 100. Thus, performance of a device employing cooling system 200 may be improved. In addition, suspending cooling element 220 from anchor 260 may further enhance performance. In particular, vibrations in cooling system 200 that may affect other cooling cells (not shown) may be reduced. For example, less vibration may be induced in top plate 210 due to the motion of cooling element 220. Consequently, cross talk between cooling system 200 and other cooling systems (e.g. other cells) or other portions of the device incorporating cooling system 200 may be reduced. Thus, performance may be further enhanced.

Figure 3A:
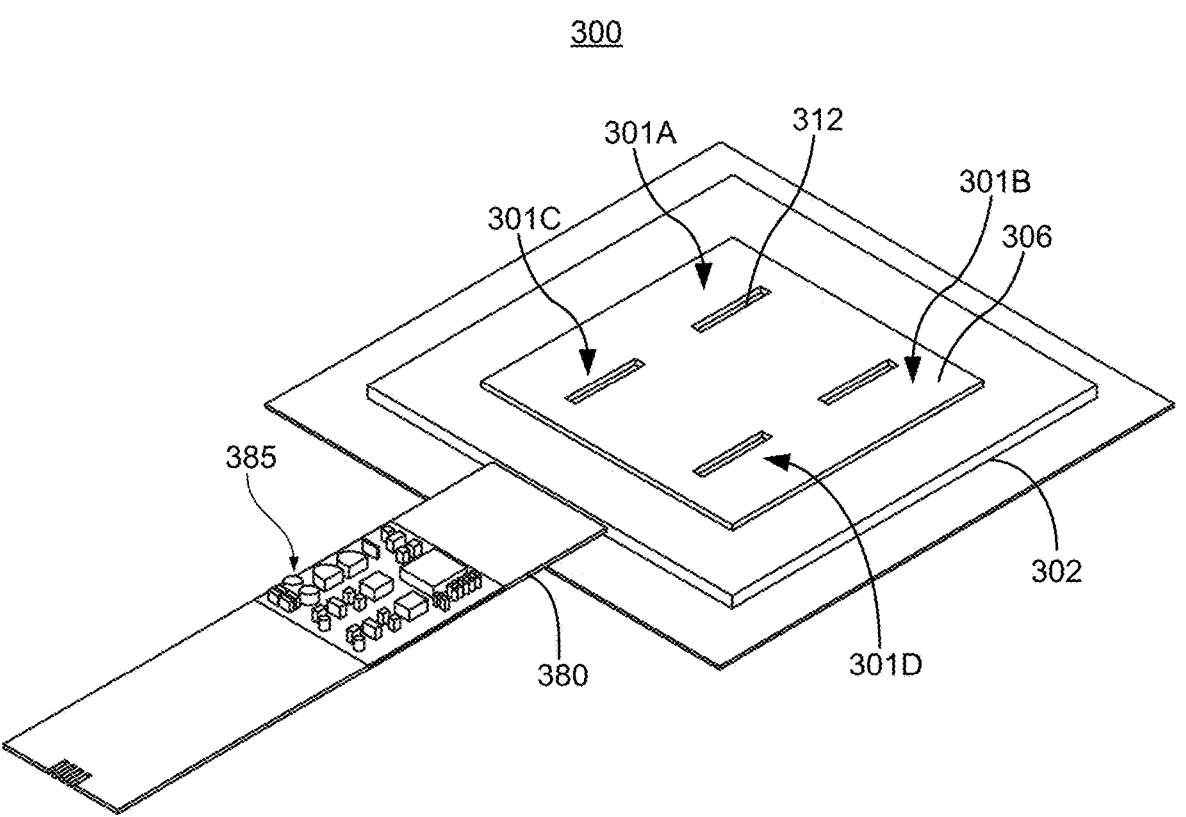
FIGS. 3A-3E depict an embodiment of an active MEMS cooling system formed in a tile.
Figure 3B:
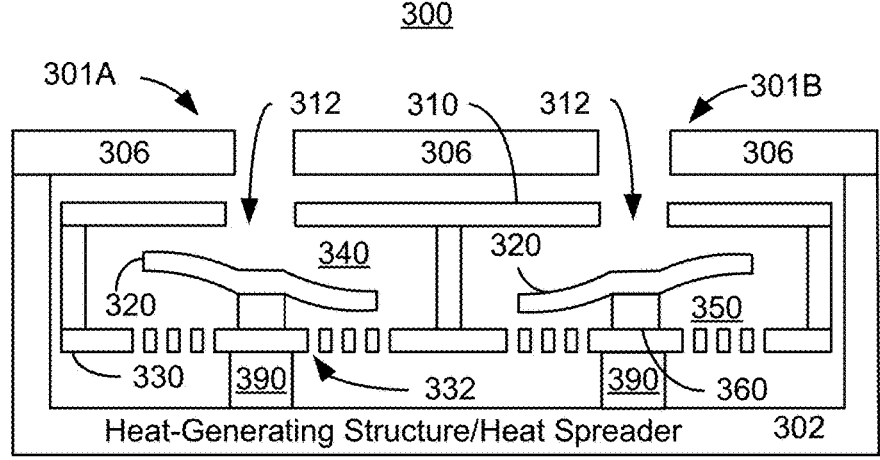
Figure 3C:
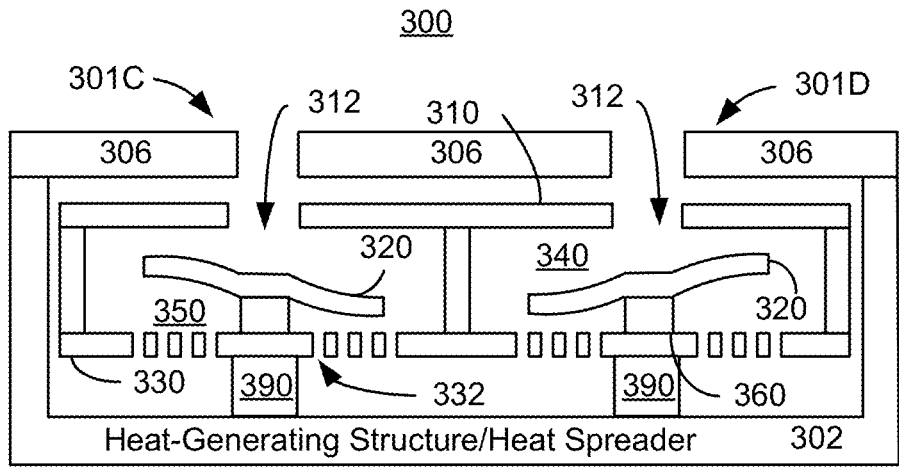
Figure 3D:
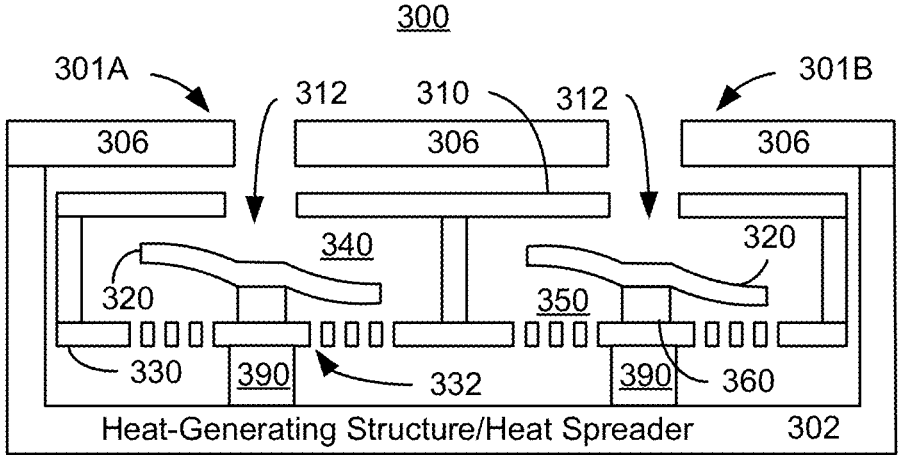
Figure 3E:
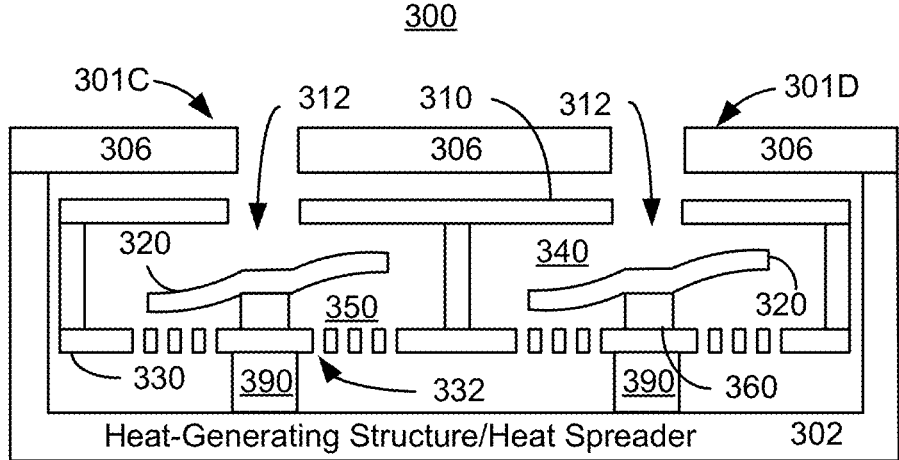

FIGS. 3A-3E depict an embodiment of active MEMS cooling system 300 including multiple cooling cells configured as a module termed a tile, or array. FIG. 3A depicts a perspective view, while FIGS. 3B-3E depict side views. FIGS. 3A-3E are not to scale. Cooling system 300 includes four cooling cells 301A, 301B, 301C and 301D (collectively or generically 301), which are analogous to one or more of cooling systems described herein. More specifically, cooling cells 301 are analogous to cooling system 100 and/or 200. Tile 300 thus includes four cooling cells 301 (i.e. four MEMS jets). Although four cooling cells 301 in a 2×2 configuration are shown, in some embodiments another number and/or another configuration of cooling cells 301 might be employed. In the embodiment shown, cooling cells 301 include shared top plate 310 having apertures 312, cooling elements 320, shared orifice plate 330 including orifices 332, top chambers 340, bottom chambers 350, anchors (support structures) 360, and pedestals 390 that are analogous to top plate 110 having apertures 112, cooling element 120, orifice plate 130 having orifices 132, top chamber 140, bottom chamber 150, anchor 160, and pedestal 190. In some embodiments, cooling cells 301 may be fabricated together and separated, for example by cutting through top plate 310, side walls between cooling cells 301, and orifice plate 330. Thus, although described in the context of a shared top plate 310 and shared orifice plate 330, after fabrication cooling cells 301 may be separated. In some embodiments, tabs (not shown) and/or other structures such as anchors 360 may connect cooling cells 301. Further, tile 300 includes heat-generating structure (termed a heat spreader hereinafter) 302 (e.g. a heat sink, a heat spreader, and/or other structure) that also has sidewalls, or fencing, in the embodiment shown. Cover plate 306 having apertures therein is also shown. Heat spreader 302 and cover plate 306 may be part of an integrated tile 300 as shown or may be separate from tile 300 in other embodiments. Heat spreader 302 and cover plate 306 may direct fluid flow outside of cooling cells 301, provide mechanical stability, and/or provide protection. Electrical connection to cooling cells 301 is provided via flex connector 380 (not shown in FIGS. 3B-5E) which may house drive electronics 385. Cooling elements 320 are driven out-of-phase (i.e. in a manner analogous to a seesaw). Further, as can be seen in FIGS. 3B-3C and FIGS. 3D-3E cooling element 320 in one cell is driven out-of-phase with cooling element(s) 320 in adjacent cell(s). In FIGS. 3B-3C, cooling elements 320 in a row are driven out-of-phase. Thus, cooling element 320 in cell 301A is out-of-phase with cooling element 320 in cell 301B. Similarly, cooling element 320 in cell 301C is out-of-phase with cooling element 320 in cell 301D. In FIGS. 3D-3E, cooling elements 320 in a column are driven out-of-phase. Thus, cooling element 320 in cell 301A is out-of-phase with cooling element 320 in cell 301C. Similarly, cooling element 320 in cell 301B is out-of-phase with cooling element 320 in cell 301D. By driving cooling elements 320 out-of-phase, vibrations in cooling system 300 may be reduced. Cooling elements 320 may be driven in another manner in some embodiments.

Cooling cells 301 of cooling system 300 function in an analogous manner to cooling system(s) 100, 200, and/or an analogous cooling system. Consequently, the benefits described herein may be shared by cooling system 300. Because cooling elements in nearby cells are driven out-of-phase, vibrations in cooling system 300 may be reduced. Because multiple cooling cells 301 are used, cooling system 300 may enjoy enhanced cooling capabilities. Further, multiples of individual cooling cells 301 and/or cooling system 300 may be combined in various fashions to obtain the desired footprint of cooling cells.

Systems 100, 200, and 300 are generally desired to be integrated into devices, such as computing devices, for which cooling is desired. In addition to space and other constraints, cooling systems such as systems 100, 200, and

300 are desired to maintain a higher rate of fluid flow, efficiently transfer heat from the heat-generating structure, and reduce the amount of heat transferred back into the device from the cooling systems. Thus, additional control of the fluid flow through the cooling system and the devices in which such systems are incorporated is desired.

Figure 4A:
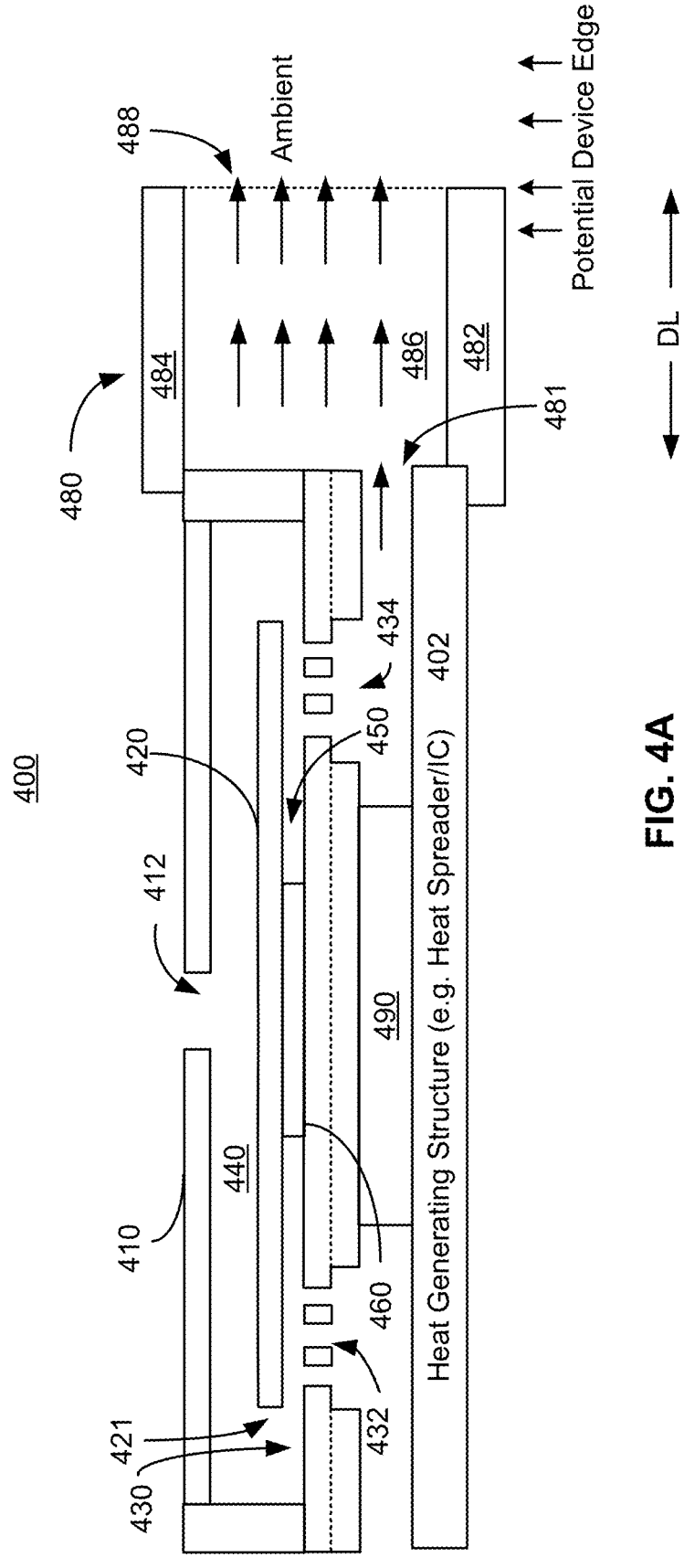
FIGS. 4A-4D depict an embodiment of an active MEMS fluid transfer system including a dissipation region and embodiments of fluid flows.

FIGS. 4A-4D depict an embodiment of active MEMS cooling system 400 and corresponding fluid flows. MEMS cooling system 400 may also be considered to be a heat transfer or fluid transfer system. However, for simplicity, system 400 is referred to as a cooling system. FIG. 4A depicts a side view of cooling system 400. FIG. 4A is not to scale. For simplicity, only portions of cooling system 400 are shown. Cooling system 400 is analogous to cooling system(s) 100, 200, and/or 300. Consequently, analogous components have similar labels. For example, cooling system 400 is used in conjunction with heat-generating structure 402, which is analogous to heat-generating structure(s) 102, 202, and 302. In the embodiment shown, heat-generating structure 402 is a heat spreader that is integrated into system 400. Heat spreader 402 is thermally coupled with heat source(s), such as integrated circuit(s), battery/batteries, and/or components that are desired to be cooled.

Cooling system 400 includes top plate 410 having vent(s) 412 (only one of which is shown), cooling element 420 having tip 421, orifice plate 430 including orifices 432 and cavities 434, top chamber 440 having a gap, bottom chamber 450 having a gap, flow chamber 440/450, and anchor (i.e. support structure) 460 that are analogous to top plate 110 having vent 112, cooling element 120 having tip 121, orifice plate 130 including orifices 132 and cavities 134, top chamber 140 having gap 142, bottom chamber 150 having gap 152, flow chamber 140/150, and anchor (i.e. support structure) 160, respectively. Also shown is pedestal 490 that is analogous to pedestal 190. Cooling element 420 is centrally supported by anchor 460 such that at least a portion of the perimeter of cooling element 420 is free to vibrate. In some embodiments, anchor 460 extends along the axis of cooling element 220. In other embodiments, anchor 460 is only near the center portion of cooling element 420. In some embodiments, cooling element 420 includes an anchored region and cantilevered arms including step region, extension region, and outer regions analogous to anchored region 122, cantilevered arms 123, step region 124, extension region 126, and outer region 128 of cooling element 120'. In some embodiments, cantilevered arms of cooling element 420 are driven in-phase. In some embodiments, cantilevered arms of cooling element 420 are driven out-of-phase. In some embodiments, a simple cooling element, such as cooling element 120, may be used. In some embodiments, cooling system 400 includes multiple cooling cells analogous to cooling cells 301.

Cooling system 400 also includes spout 480 having dissipation region 486 therein. Spout 480 includes a housing having bottom 482 and top 484, entrance 481 and exit 486. Entrance 481 is fluidically coupled with orifices 432 (i.e. egresses from flow chamber 440/450). The direction of fluid flow from flow chamber 440/450 may be seen by the unlabeled arrows in FIG. 4A.

Cooling system 400 operates in an analogous manner to cooling system 100. Cooling element 420 is activated to undergo vibrational motion (e.g. in a see-saw configuration). The vibrational motion of cooling element 420 draws fluid (e.g. air) into aperture 412, drives the fluid through flow chamber 440/450, and drives the fluid out of flow chamber 440/450 via orifices/egresses 432. Because cooling element 420 vibrates, the flow of fluid pulsates. Thus, the pressure of the fluid also pulsates between higher and lower pressures. In some embodiment, a pulsating pressure wave may be considered to be established by the vibrational motion of cooling element 420. Flow may also exit orifices 432 and travel through the jet channel in pulses. The pulsating pressure of the fluid may be considered to be a pulsating pressure wave analogous to the acoustic resonance described herein. Further, the pressure within flow chamber 440/450 and the jet channel is higher than the pressure of the ambient region. At least the high pressure of the pulsating pressure wave is higher than the ambient pressure in the region surrounding system 400 (e.g. in the devices itself or outside of the device). In some embodiments, the pressure at inlet vent 412 is substantially the same as the pressure at ambient outside of exit 486 of spout 480. However, the pressure at vent 412 may be different from the ambient pressure in proximity to and outside of exit 486 of spout 480.

Fluid exits orifices 432 and travels through the jet channel between orifice plate 430 and heat spreader 402. The fluid exits the jet channel and enters spout 480 at entrance 481. This is indicated by the unlabeled arrow in proximity to entrance 481. The fluid travels through dissipation region 486 and to exit 488. The pulsating pressure in the fluid is dissipated in dissipation region 484. Stated differently, the pulsating pressure way may be attenuated such that the pressure equilibrates and approaches (or reaches) the ambient pressure of the ambient region outside of system 400. In some embodiments, therefore, the pressure of the fluid at exit 488 of spout 480 matches or substantially matches the boundary conditions for the pressure of the ambient.

The length, DL, of dissipation region 486 is sufficient to allow partial or complete attenuation of the pulsating pressure. Thus, the pressure at 488 may be close to or the same as the ambient pressure and/or may not significantly vary (i.e. pulsate) despite the flow of fluid exiting spout 480. In some embodiments, DL is at least one millimeter. In some embodiments, the DL is at least two millimeters. In some embodiments, DL is at least 2.5 millimeters. In some embodiments, DL is not more than 5.5 millimeters. In some embodiments, DL is not more than 4.5 millimeters. Thus, DL is sufficiently long that that the pulsating pressure introduced by cooling system 400 and the flow rate dissipates. Further, exit 488 need not be at the edge of the device in which system 400 is incorporated. This is indicated by the potential device edge locations in FIG. 4A. For example, in some embodiments, exit 488 may be recessed from the edge of the device (i.e. is within the interior of the device) by as much as two millimeters. In some embodiments, exit 488 may be recessed by not more than three millimeters. In some embodiments, exit 488 may be recessed by not more than four millimeters. In some embodiments, exit 488 is flush with or protrudes from the device edge.

Cooling system 400 shares the benefits of cooling systems 100, 200, and/or 300. Thus, fluid driven by cooling system 400 efficiently cools heat spreader 402 and, therefore, structures that are thermally coupled (e.g. via conduction) with heat spreader 402. The performance of a device employing cooling system 400 may be improved. The presence of dissipation region 486 of spout 480 may further improve the efficiency of cooling system 400. Equilibration of the pulsating pressure within dissipation region 486 may enhance the flow rate of fluid through cooling system 400. A higher flow rate generally translates to a higher cooling effect. Thus, cooling system 400 may have a higher flow and improved cooling ability. Further, use of dissipation region 486 may reduce the turbulence and enhance the laminar characteristics of the flow exiting dissipation region 486 to the ambient region. As used herein, "turbulence" relates primarily to eddy creation, and not necessarily turbulence based on Reynolds numbers. A reduction in the turbulence may ensure that the fluid flows out of cooling system 400 and may reduce interactions of the flow with surrounding device components. Stated differently, the reduction in turbulence may reduce dumping of heat carried by the fluid back into the device. A less turbulent/more laminar flow may also allow exit 488 to be recessed from the device edge without dumping a significant amount of heat back into the device. Thus, efficiency of cooling system 400 may be improved. Moreover, a more ordered flow exiting spout 480 may reduce noise associated with operation of system 400. A reduction in noise is generally desirable. Spout 420 may also be used to direct the flow exiting system 400. As shown in FIG. 4A, the flow is directed substantially parallel to the bottom of heat spreader 402 (i.e. horizontal). In some embodiments, spout 480 may be angled (e.g. either the entire spout 480 angled or one or both of the surfaces angled) in order to direct the flow at an angle from horizontal. Thus, system 400 may also have improved flow control.

Figures 4B, 4C, 4D:
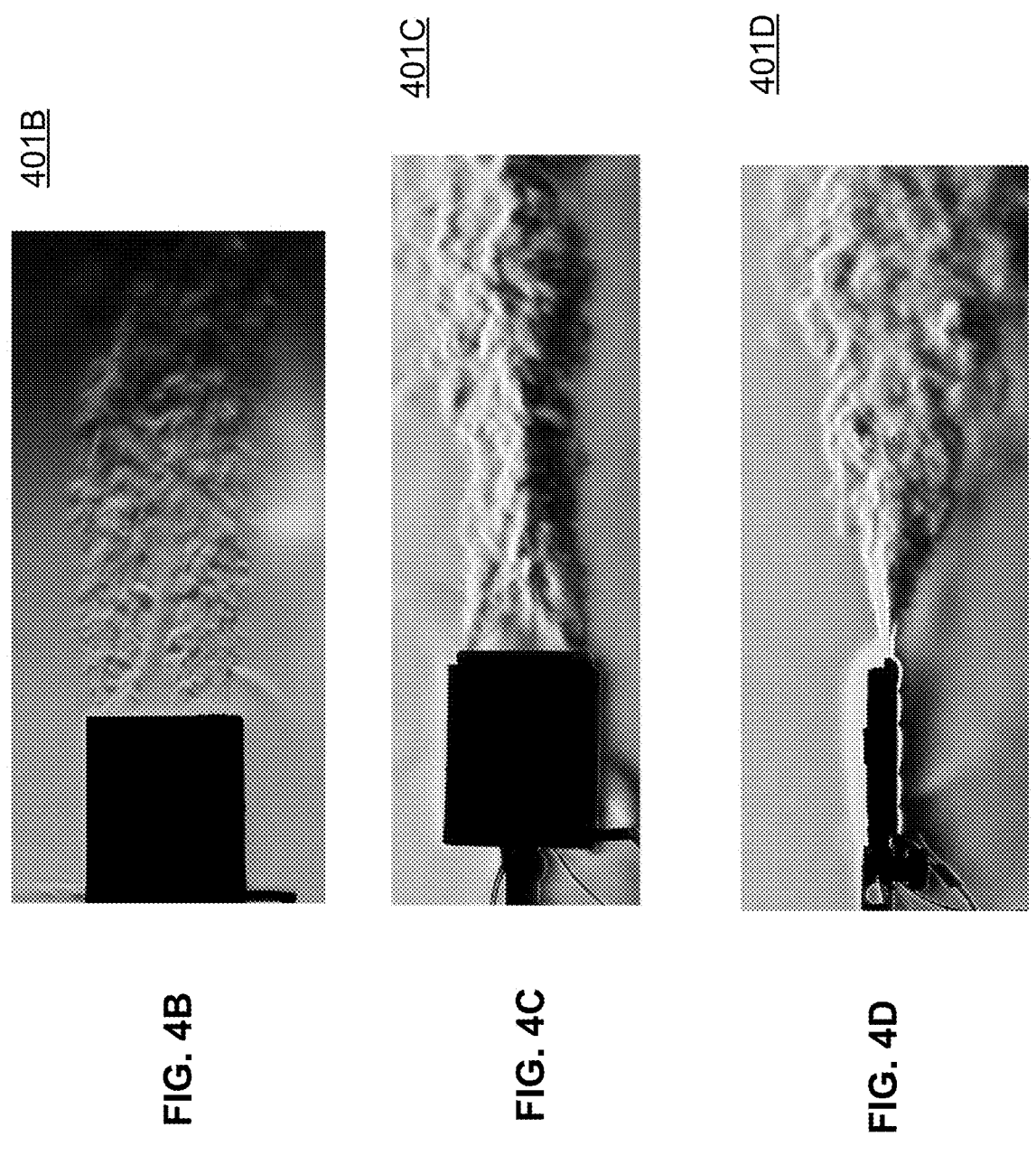

For example, FIGS. 4B-4D indicate exit flows 401B, 401C, and 401D from cooling systems. FIG. 4B depicts a top view of flow 401B from a cooling system not having a dissipation region analogous to dissipation region 486 of spout 480. FIGS. 4C and 4D depict top and side views of a flow 401C and 401D, respectively from a cooling system having a dissipation region analogous to dissipation region 486 of spout 480. The cooling systems depicted in FIGS. 4B-4D have two rows of cooling cells in an analogous manner to system 300. Flow 401B indicates two separate flows from the two rows as well as structure in proximity to the exit of the cooling system. Thus, the flow 401B may be more turbulent. Further, the flow rate may be lower. In contrast, flows 401C and 401D indicate a single more laminar flow from the cooling system. As a result, flows 401C and 401D may have less divergence in the region proximate to the exit than flow 401B. This may allow the flow to travel farther from the exit before diverging enough to interact with other portions of the device. Flows 401C and 401D have less structure proximate to the exit. This corresponds to less turbulence near the cooling system. A higher flow of fluid may also be present. Thus, cooling systems analogous to cooling system 400 may have improved flow, less dumping of heat carried by the fluid back into the device, and improved efficiency.

Figure 5A:
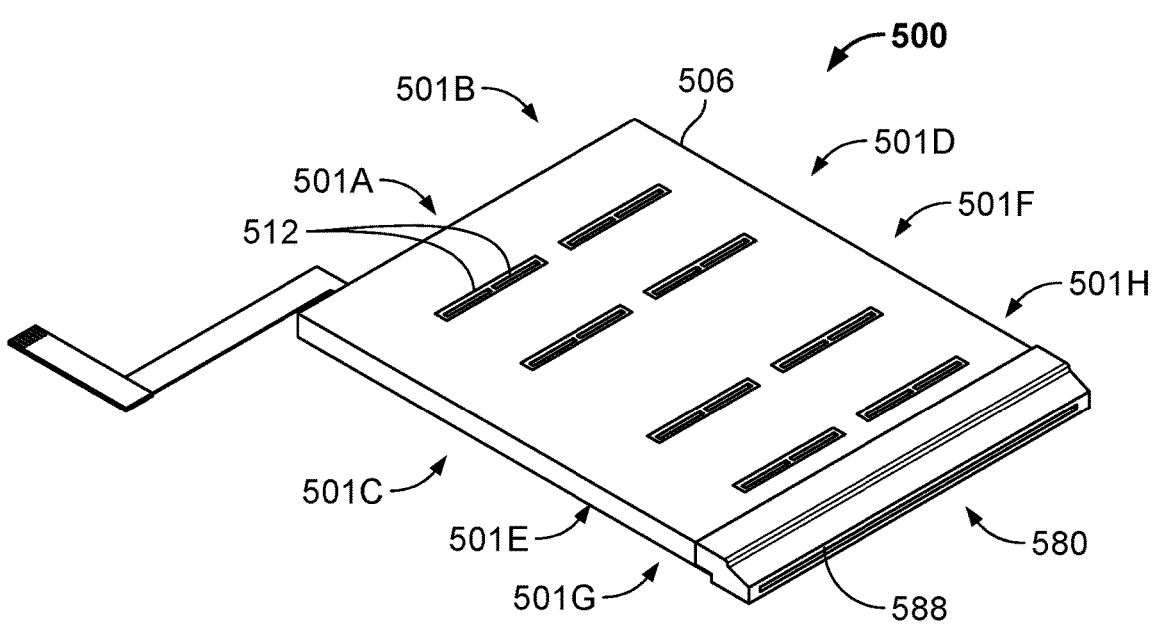
FIGS. 5A-5B depict an embodiment of an active MEMS fluid transfer system including a dissipation region.
Figure 5B:
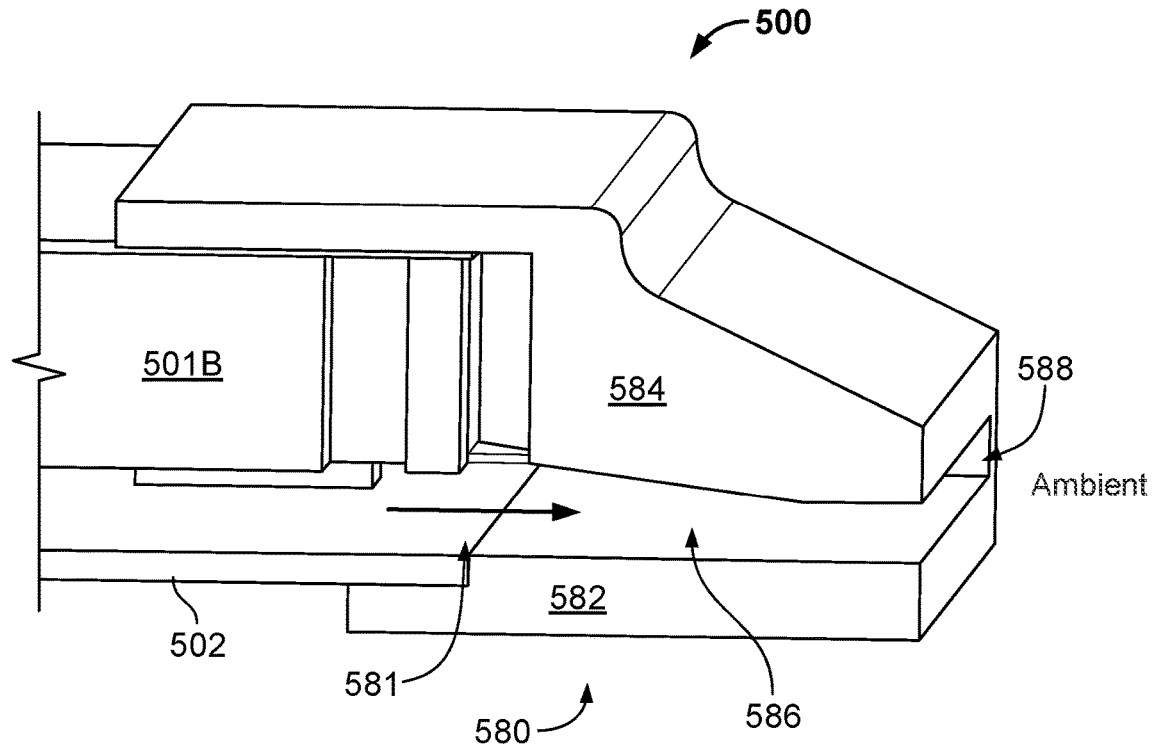

FIGS. 5A-5B depict an embodiment of active MEMS cooling system 500. FIG. 5A depicts a perspective view of cooling system 500, while FIG. 5B is a cross-sectional view of a portion of cooling system 500. MEMS cooling system 500 may also be considered to be a heat transfer or fluid transfer system. However, for simplicity, system 500 is referred to as a cooling system. For simplicity, only portions of cooling system 500 are shown. Cooling system 500 is analogous to cooling system(s) 100, 200, 300, and/or 400. Consequently, analogous components have similar labels. For example, cooling system 500 is used in conjunction with heat-generating structure 502, which is analogous to heat-generating structure(s) 102, 202, 302, and 402. In the embodiment shown, heat-generating structure 502 is a heat spreader that is integrated into system 500. Heat spreader 502 is thermally coupled with heat source(s), such as integrated circuit(s), battery/batteries, and/or components that are desired to be cooled. Cooling system 500 includes cooling cells 501A, 50B, 501C, 501D, 501E, 501F, 501G, and 501H (collectively or generically cooling cell(s) 501).

Each cooling cell 501 includes inlet vents 512. Also shown is top cover 506 that is coupled with heat spreader 502.

Cooling system 500 also includes spout 580 having dissipation region 586 therein. Spout 580 also includes a housing including bottom 582 and top 584, entrance 581 and exit 588. Fluid is received at entrance 581 from the jet channel of system 500. In some embodiments, spout 580 is attached to heat spreader 502 and/or cover 506 of system 500. In some embodiments, spout 480 is integrally formed with heat spreader 502. In addition, the height of dissipation region 586 is reduced in proximity to exit 588. Stated differently, spout 480 and dissipation region 496 are tapered. In some embodiments, the height or area may be tapered by sixty percent (e.g. from a height of 2.5 millimeters to a height of approximately one millimeter) substantially without affecting flow. In some embodiments, the height or area may be tapered by over sixty five percent (e.g. from a height of 2.5 millimeters to a height of approximately one millimeters) without suffering a reduction in flow of more than five percent. In general, spout 580 may be tapered such that the flow rate is not reduced by more than a specified percentage (e.g. five percent). Further, the typical exit gap may be less than one millimeter (e.g. 0.95 millimeter). Such a gap meets the typical rules of consumer devices (e.g. less than one millimeter for finger poking) and at the same time not losing flow.

Cooling system 500 shares the benefits of cooling system 400. Fluid driven by cooling system 500 efficiently cools heat spreader 502 and, therefore, structures that are thermally coupled with heat spreader 502. The performance of a device employing cooling system 500 may be improved. The presence of dissipation region 586 of spout 580 may further improve the efficiency of cooling system 500. In particular, flow may be enhanced and turbulence near exit 588 reduced. In addition, the flow exiting spout 580 may be quieter and may be directed by the geometry or orientation of spout 580. Thus, cooling efficiency may be improved and performance of a device incorporating cooling system 500 enhanced.

Figures 6, 7, 8:
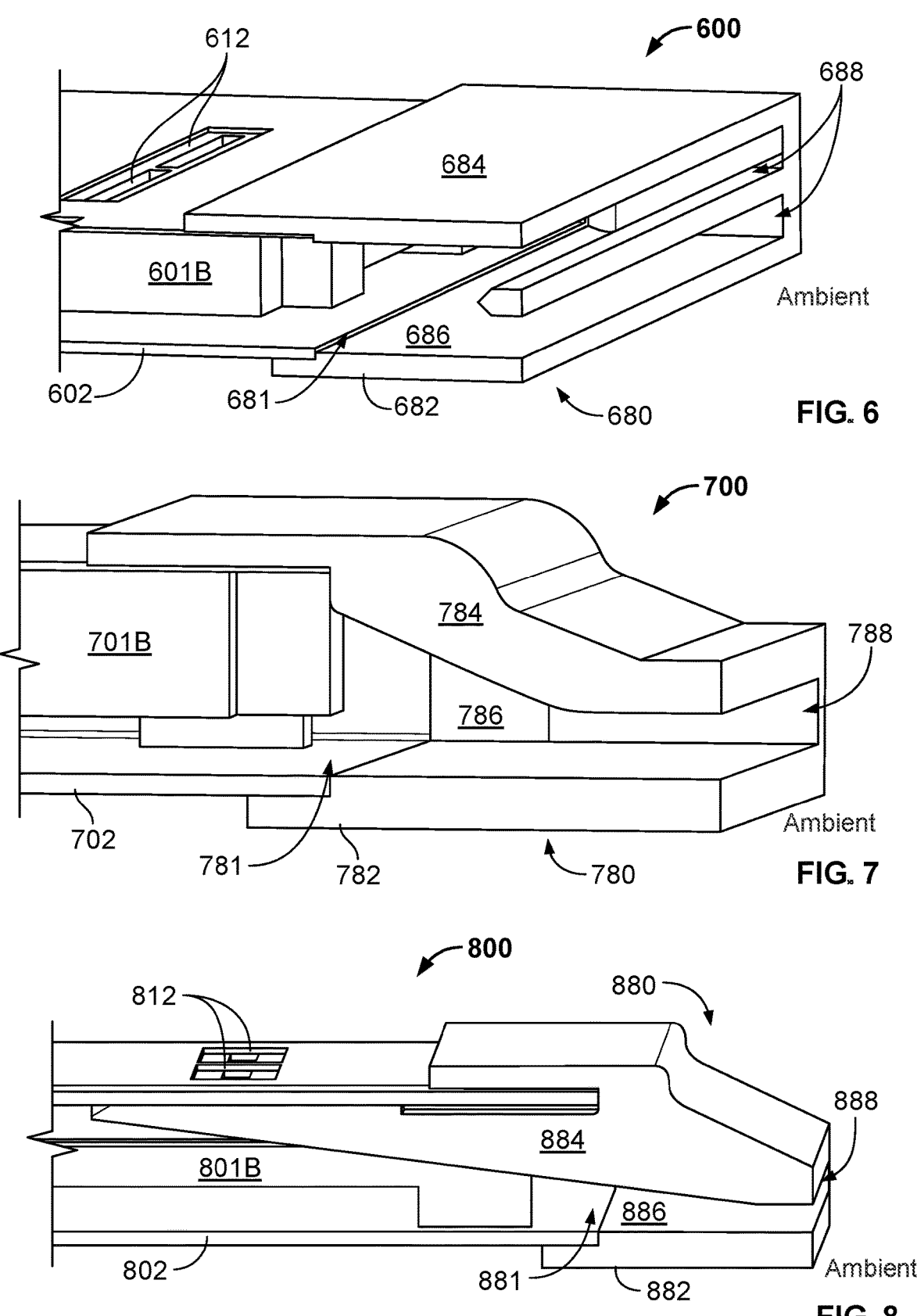
FIG. 6 depicts an embodiment of an active MEMS fluid transfer system including a dissipation region.
FIG. 7 depicts an embodiment of an active MEMS fluid transfer system including a dissipation region.
FIG. 8 depicts an embodiment of an active MEMS fluid transfer system including a dissipation region.

FIG. 6 depicts an embodiment of active MEMS cooling system 600. MEMS cooling system 600 may also be considered to be a heat transfer or fluid transfer system. However, for simplicity, system 600 is referred to as a cooling system. For simplicity, only portions of cooling system 600 are shown. Cooling system 600 is analogous to cooling system(s) 100, 200, 300, 400, and/or 500. Consequently, analogous components have similar labels. For example, cooling system 600 is used in conjunction with heat-generating structure 602, which is analogous to heat-generating structure(s) 102, 202, 302, 402, and 502. In the embodiment shown, heat-generating structure 602 is a heat spreader that is integrated into system 600. Heat spreader 602 is thermally coupled with heat source(s), such as integrated circuit(s), battery/batteries, and/or components that are desired to be cooled. Cooling system 600 may include multiple cooling cells. Also shown is top cover 606 that is coupled with heat spreader 602.

Cooling system 600 includes spout 680 having dissipation region 686 therein. Spout 680 also includes a housing including bottom 682 and top 684, entrance 681 and exit 688. Fluid is received at entrance 681 from the jet channel of system 600. In some embodiments, spout 680 is attached to heat spreader 602 and/or the cover of system 600. In some embodiments, spout 680 is integrally formed with heat spreader 602. Exit 688 of spout 680 has been divided into two regions.

Cooling system 600 shares the benefits of cooling system(s) 400 and/or 500. Fluid driven by cooling system 600 efficiently cools heat spreader 602 and, therefore, structures that are thermally coupled with heat spreader 602. The performance of a device employing cooling system 600 may be improved. The presence of dissipation region 686 of spout 680 may further improve the efficiency of cooling system 600. In particular, flow may be enhanced and turbulence near exit 688 reduced. In addition, the flow exiting spout 680 may be quieter and may be directed by the geometry or orientation of spout 680. Thus, cooling efficiency may be improved and performance of a device incorporating cooling system 600 enhanced.

FIG. 7 depicts an embodiment of active MEMS cooling system 700. MEMS cooling system 700 may also be considered to be a heat transfer or fluid transfer system. However, for simplicity, system 700 is referred to as a cooling system. For simplicity, only portions of cooling system 700 are shown. Cooling system 700 is analogous to cooling system(s) 100, 200, 300, 400, 500, and/or 600. Consequently, analogous components have similar labels. For example, cooling system 700 is used in conjunction with heat-generating structure 702, which is analogous to heat-generating structure(s) 102, 202, 302, 402, 502, and 602. In the embodiment shown, heat-generating structure 702 is a heat spreader that is integrated into system 700. Heat spreader 702 is thermally coupled with heat source(s), such as integrated circuit(s), battery/batteries, and/or components that are desired to be cooled. Cooling system 700 may include multiple cooling cells. Also shown is a top cover that is coupled with heat spreader 702.

Cooling system 700 includes spout 780 having dissipation region 786 therein. Spout 780 also includes a housing including bottom 782 and top 784, entrance 781 and exit 788. Fluid is received at entrance 781 from the jet channel of system 700. In some embodiments, spout 780 is attached to heat spreader 702 and/or the cover of system 700. In some embodiments, spout 780 is integrally formed with heat spreader 702. Spout 780 has a tapered height analogous to that of spout 580.

Cooling system 700 shares the benefits of cooling system(s) 400, 500, and/or 600. Fluid driven by cooling system 700 efficiently cools heat spreader 702 and, therefore, structures that are thermally coupled with heat spreader 702. The performance of a device employing cooling system 700 may be improved. The presence of dissipation region 786 of spout 780 may further improve the efficiency of cooling system 700. In particular, flow may be enhanced and turbulence near exit 788 reduced. In addition, the flow exiting spout 780 may be quieter and may be directed by the geometry or orientation of spout 780. Thus, cooling efficiency may be improved and performance of a device incorporating cooling system 700 enhanced.

FIG. 8 depicts an embodiment of active MEMS cooling system 800. MEMS cooling system 800 may also be considered to be a heat transfer or fluid transfer system. However, for simplicity, system 800 is referred to as a cooling system. For simplicity, only portions of cooling system 800 are shown. Cooling system 800 is analogous to cooling system(s) 100, 200, 300, 400, 500, 600, and/or 700. Consequently, analogous components have similar labels. For example, cooling system 800 is used in conjunction with heat-generating structure 802, which is analogous to heat-generating structure(s) 102, 202, 302, 402, 502, 602 and 702. In the embodiment shown, heat-generating structure 802 is a heat spreader that is integrated into system 800. Heat spreader 802 is thermally coupled with heat source(s), such as integrated circuit(s), battery/batteries, and/or components that are desired to be cooled. Cooling system 800 may include multiple cooling cells. Also shown is a top cover that is coupled with heat spreader 802.

Cooling system 800 includes spout 880 having dissipation region 886 therein. Spout 880 also includes a housing including bottom 882 and top 884, entrance 881 and exit 888. Fluid is received at entrance 881 from the jet channel of system 800. In some embodiments, spout 880 is attached to heat spreader 802 and/or the cover of system 800. In some embodiments, spout 880 is integrally formed with heat spreader 802. Spout 880 has a tapered height analogous to that of spouts 580 and 780. However, in the embodiment shown, the taper for spout 580 commences within the jet channel (before the fluid reaches entrance 881).

Cooling system 800 shares the benefits of cooling system(s) 400, 500, 600, and/or 700. Fluid driven by cooling system 800 efficiently cools heat spreader 802 and, therefore, structures that are thermally coupled with heat spreader 802. The performance of a device employing cooling system 800 may be improved. The presence of dissipation region 886 of spout 880 may further improve the efficiency of cooling system 800. In particular, flow may be enhanced and turbulence near exit 888 reduced. In addition, the flow exiting spout 880 may be quieter and may be directed by the geometry or orientation of spout 880. Thus, cooling efficiency may be improved and performance of a device incorporating cooling system 800 enhanced.

Figure 9:
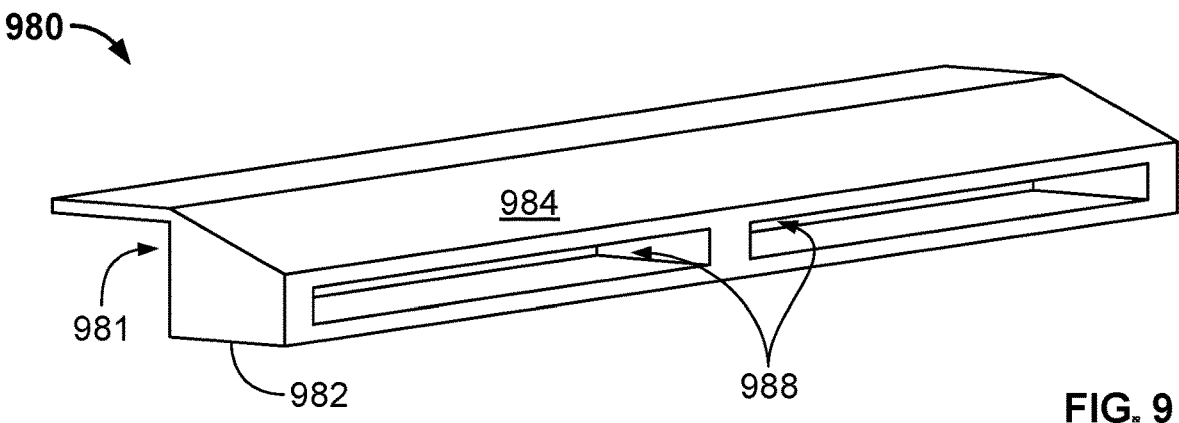
FIG. 9 depicts an embodiment of a spout for forming a dissipation region for an active MEMS fluid transfer system.

FIG. 9 depicts an embodiment of spout 980 usable in an active MEMS cooling system. For simplicity, only portions of spout 980 are shown. Spout 980 may be used in cooling system(s) 100, 200, 300, 400, 500, 600, 700, 800, and/or an analogous cooling system. Consequently, analogous components have similar labels. Spout 980 has a dissipation region (not labeled in FIG. 9) therein. Spout 980 also includes a housing including bottom 982 and top 984, entrance 981 and exit 988. Fluid is received at entrance 981 from the jet channel of a cooling system. In some embodiments, spout 980 is attached to the heat spreader and/or the cover of the cooling system. In some embodiments, spout 980 is integrally formed with the heat spreader. Spout 980 has a tapered height analogous to that of spouts 580, 780, and/or 880.

Spout 980 provides the benefits of spouts 480, 580, 680, 780, and/or 880. Fluid driven by the corresponding cooling system efficiently cools heat-generating structures. The presence of dissipation region 986 of spout 980 may further improve the efficiency of a cooling system incorporating spout 980. In particular, flow may be enhanced and turbulence near exit 988 reduced. In addition, the flow exiting spout 980 may be quieter and may be directed by the geometry or orientation of spout 980. Thus, cooling efficiency may be improved and performance of a device incorporating cooling system 900 enhanced.

Figure 10A:
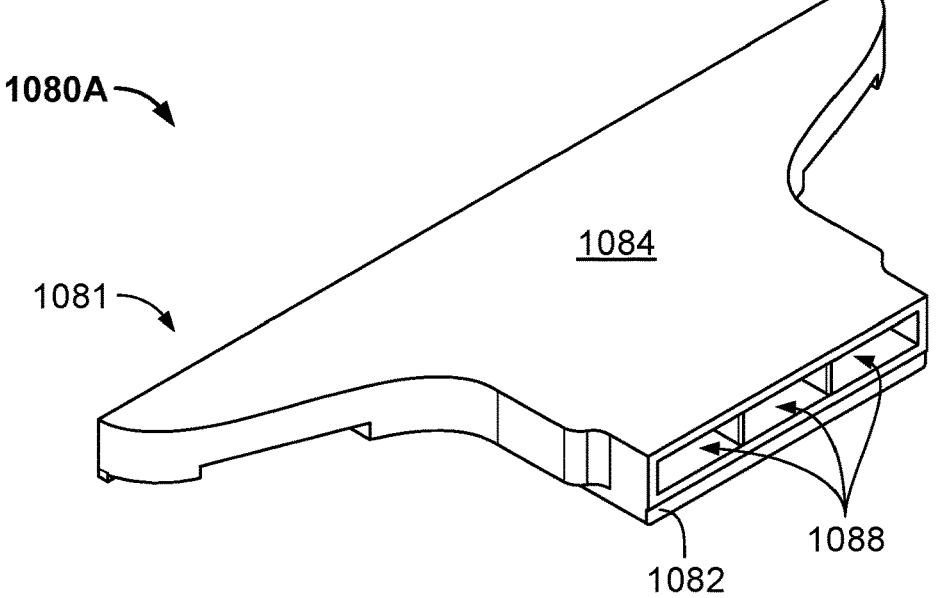
FIGS. 10A-10B depict an embodiment of a spout for forming a dissipation region for an active MEMS fluid transfer system.
Figure 10B:
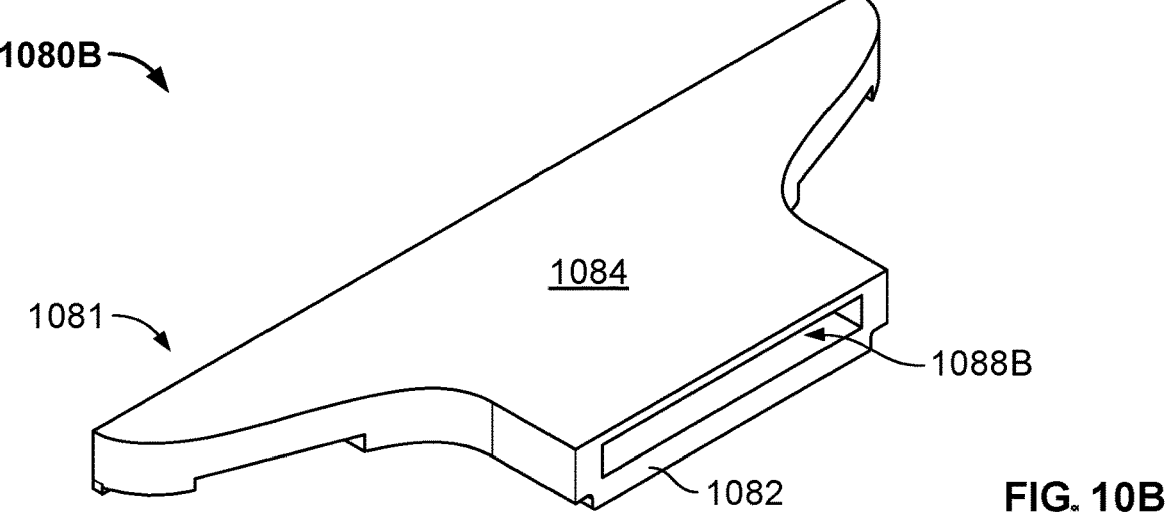

FIGS. 10A and 10B depict embodiments of spouts 1080A and 1080B usable in an active MEMS cooling system. For simplicity, only portions of spouts 1080A and 1080B are shown. Spouts 1080A and 1080B may be used in cooling system(s) 100, 200, 300, 400, 500, 600, 700, 800, and/or an analogous cooling system. Consequently, analogous components have similar labels. Spouts 1080A and 1080B each have a dissipation region (not labeled in FIGA and therein. Each of spouts 1080A and 1080B also includes a housing including bottom 1082 and top 1084, entrance 1081 and exit 1088. Fluid is received at entrance 1081 from the jet channel of a cooling system. In some embodiments, spouts 1080A and 1080B are attached to the heat spreader and/or the cover of the cooling system. In some embodiments, spouts 1080A and 1080B are each integrally formed with the heat spreader. Spouts 1080A and 1080B each have a tapered width, instead of a tapered height. However, the fractional reduction in the area or width is analogous to that of spouts 580, 780, and/or 880.

Spouts 1080A and 1080B provide the benefits of spouts 480, 580, 680, 780, 880, and/or 980. Fluid driven by the corresponding cooling system efficiently cools heat-generating structures. The presence of dissipation region 1086 of spouts 1080A and 1080B may further improve the efficiency of a cooling system incorporating spouts 1080A and 1080B. In particular, flow may be enhanced and turbulence near exit 1088 reduced. In addition, the flow exiting spouts 1080A and 1080B may be quieter and may be directed by the geometry or orientation of spout 1080A or 1080B. Thus, cooling efficiency may be improved and performance of a device incorporating cooling system 1000 enhanced.

Figures 11A, 11B, 11C, 11D:
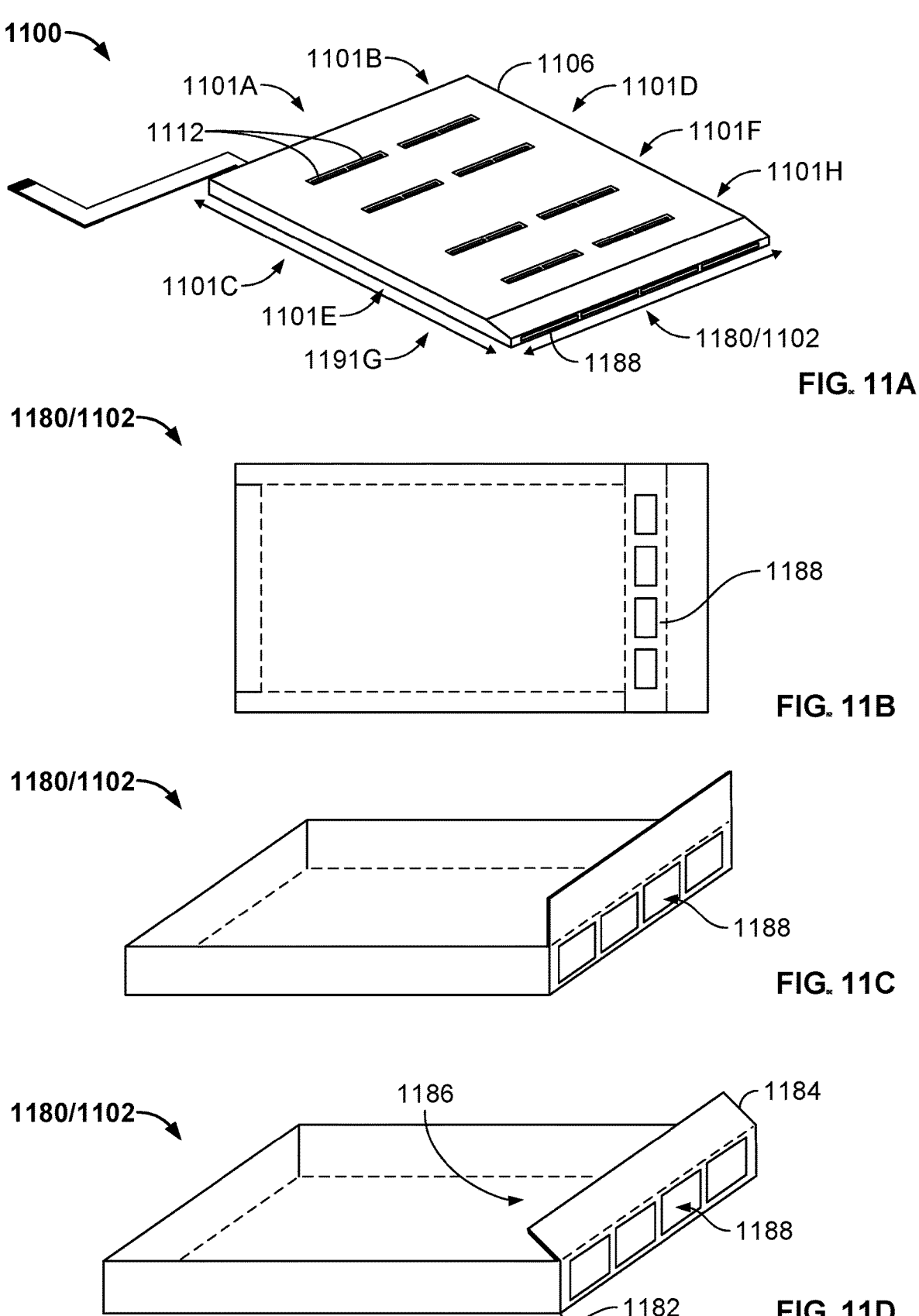
FIGS. 11A-11D depict an embodiment of an active MEMS cooling system including a dissipation region.

FIGS. 11A-11D depict an embodiment of active MEMS cooling system 1100 and corresponding integrated spout 1180. Referring to FIG. 11A, MEMS cooling system 1100 may also be considered to be a heat transfer or fluid transfer system. However, for simplicity, system 1100 is referred to as a cooling system. For simplicity, only portions of cooling system 1100 are shown. Cooling system 1100 is analogous to cooling system(s) 100, 200, 300, 400, 500, 600, 700, and/or 800. Consequently, analogous components have similar labels. For example, cooling system 1100 is used in conjunction with heat-generating structure 1102, which is analogous to heat-generating structure(s) 102, 202, 302, 402, 502, 602 and 702. In the embodiment shown, heat-generating structure 1102 is a heat spreader that is integrated into system 1100. Heat spreader 1102 is thermally coupled with heat source(s), such as integrated circuit(s), battery/batteries, and/or components that are desired to be cooled. Cooling system 1100 may include multiple cooling cells. Also shown is a top cover that is coupled with heat spreader 1102.

Cooling system 1100 includes spout 1180 having dissipation region 1186 therein. Spout 1180 also includes a housing including bottom 1182 and top 1184, an entrance (not separately labeled) and exits 1188. Fluid is received at the entrance from the jet channel of system 1100. In the embodiment shown, spout 1180 integrally formed with heat spreader 1102. Spout 1180 has a tapered height analogous to that of spouts 580 and 780. However, in the embodiment shown, the taper for spout 580 commences within the jet channel (before the fluid reaches entrance 1181).

Referring to FIGS. 11B-11D, formation of the integrated spout 1180 and heat spreader 1102 is indicated. In some embodiments, a sheet of copper or analogous material that can be bent or otherwise formed in the desired shape and which has high thermal conductivity is used. The sheet is prepared for formation into heat spreader 1102/spout 1180. For example, apertures corresponding to exits 1188 and regions to be bent (indicated by dotted lines in FIG. 11B) are formed. FIG. 11C depicts integrated spout 1180/heat spreader 1102 during formation. Thus, the sheet has been bent to partially form the spout. FIG. 11D depicts integrated spout 1180/heat spreader 1102 after final bends forming dissipation region 1186 have been formed. integrated spout 1180/heat spreader 1102 may be affixed to cooling cells to provide system 1100.

Cooling system 1100 shares the benefits of cooling system(s) 400, 500, 600, 700, and/or 800. Fluid driven by cooling system 1100 efficiently cools heat spreader 1102 and, therefore, structures that are thermally coupled with heat spreader 1102. The performance of a device employing cooling system 1100 may be improved. The presence of dissipation region 1186 of spout 1180 may further improve the efficiency of cooling system 1100. In particular, flow may be enhanced and turbulence near exit 1188 reduced. In addition, the flow exiting spout 1180 may be quieter and may be directed by the geometry or orientation of the dissipation region 1186. Thus, cooling efficiency may be improved and performance of a device incorporating cooling system 1100 enhanced. Although integrated spout 1180, as well as the other spouts such as spouts 480, 580, 680, 780, 880, 980, 1080A, 1080B, 1180, shown, can also be formed of multiple pieces. For example, integrated spout 1180 may be made using two pieces of copper: a flat piece at the bottom and a shaped/formed part for the dissipation region that are glued, soldered, or otherwise affixed together.

Figure 12:
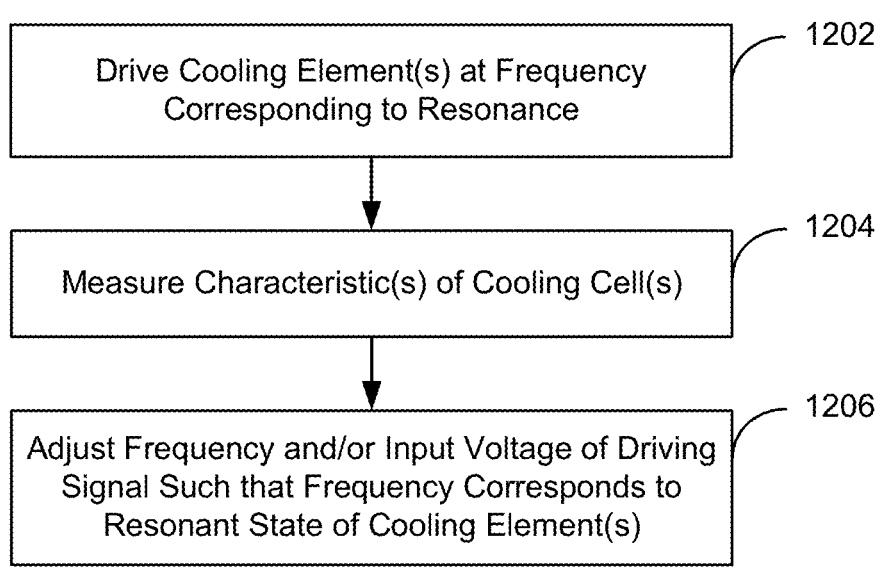
FIG. 12 depicts an embodiment of a method for using an active cooling mems system.

FIG. 12 depicts an embodiment of method 1200 for using an active cooling system. Method 1200 may include steps that are not depicted for simplicity. Method 1200 is described in the context of system 400. However, method 1200 may be used with other cooling systems including but not limited to systems and cells described herein.

A driving signal at a frequency and an input voltage corresponding to the resonant state of one or more cooling elements is provided to the active MEMS cooling system, at 1202. In some embodiments, a driving signal having the frequency corresponding to the resonant frequency of a specific cooling element is provided to that cooling element. In some embodiments, a driving signal is provided to multiple cooling elements. In such embodiments, the frequency of the driving signal corresponds to the resonant state of one or more cooling elements being driven, a statistical measure of the resonance, and/or within a threshold of the resonance as discussed above.

Characteristic(s) of the MEMS cooling system are monitored while the cooling element(s) are driven to provide a feedback signal corresponding to a proximity to a resonant state of the cooling element(s), at 1204. In some embodiments, characteristic(s) of each individual cooling element are monitored to determine the deviation of the frequency of vibration for that cooling element from the resonant frequency of that cooling element. In some embodiments, characteristic(s) for multiple cooling elements are monitored at 1204. The characteristic(s) monitored may be a proxy for resonance and/or a deviation therefrom. For example, the voltage at the cooling element, the power drawn by the cooling element, power output by the power source, peak-to-peak current output by the power source, peak voltage output by the power source, average current output by the power source, RMS current output by the power source, average voltage output by the power source, amplitude of displacement of the at least one cooling element, RMS current through the cooling element, peak voltage at the cooling element, average current through the cooling element, average voltage at the at least one cooling element, and/or the peak current drawn by the cooling element may be monitored. Using the characteristic(s) monitored, a deviation from the resonant state of the cooling element (e.g. deviation of the driving/vibration frequency from the resonant frequency) may be determined.

The frequency and/or input voltage is adjusted based on the feedback signal, at 1206. More specifically, 1206 includes updating the frequency and/or input voltage, based on the feedback signal, to correspond to resonant state(s) of the cooling element(s) at 1206. For example, the frequency for the drive signal may be updated to more closely match the resonant frequency/frequencies. In some embodiments, updating the frequency includes changing the frequency to correspond to a power drawn corresponding to the vibration of the cooling element(s) being maximized, a voltage provided at the cooling element(s) being maximized, a voltage across the cooling element(s) being minimized, and/or an amplitude of a current drawn by the at least one cooling element being minimized. In some embodiments, 1206 includes determining whether the feedback signal indicates that a drift in the resonant frequency of the cooling element(s) exceeds a threshold and identifying a new frequency in response to a determination that the drift exceeds the threshold. The new frequency accounts for the drift in the resonant frequency. The method also includes setting the new frequency as the frequency for the driving signal in response to the new frequency being identified.

For example, cooling element 420 in MEMS cooling system 400 is driven, at 1202. Thus, the cooling element 420 is driven at a frequency that is at or near resonance for one or more of the cooling elements. The vibrational motion of cooling element 420 transfers fluid from a high pressure region to an ambient pressure region via egresses (e.g. orifices 432). The vibrational motion includes a pulsating pressure in the fluid. The fluid passes from egresses 432 through dissipation region 486. In some embodiments, the fluid travels from egresses 432 to dissipation region 486 via the jet channel. In dissipation region 486, the pulsating pressure is dissipated such that turbulence is reduced where the fluid is introduced to the ambient pressure region.

Characteristics of cooling element 420 within MEMS cooling system 400 or 1000D are monitored, at 1204. Thus, the drift of the cooling element(s) 420 from resonance may be determined. The frequency may be adjusted based on the monitoring of 1204, at 1206. Thus, MEMS cooling system 400 may be kept at or near resonance.

Thus, using method 1200, an active cooling system, such as cooling system(s) 100, 200, 300, 400, 500, 600, 700, 800, and/or 1100 and spouts 480 580, 680, 780, 880, 980, 1080A, 1080B, and/or 1080 may be efficiently driven. These cooling systems are also configured for improved alignment, symmetry, efficiency, and/or reliability. Thus, method 1200 may be used to operate active MEMS cooling systems and achieve the benefits described herein.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
   activating an active component to undergo vibrational motion, the vibrational motion of the active component transferring fluid from a high pressure region to an ambient pressure region via an egress, the vibrational motion inducing a pulsating pressure in the fluid, the active component being in a chamber having an inlet and the egress, a channel region receiving the fluid from the egress, at least a portion of the channel region adjacent to and extending along the chamber, a first portion of the channel region having a channel region dimension in a first direction, the vibrational motion of the active component drawing the fluid into the chamber through the inlet, driving the fluid out of the chamber through the egress, the vibrational motion of the active component inducing the pulsating pressure in the fluid in the channel region;
   wherein the fluid passes from the channel through a dissipation region extending at least one millimeter and not more than 5.5 millimeters beyond an outer edge of the chamber, at least a portion of the dissipation region having a dissipation region dimension in the first direction, the dissipation region dimension being greater than the channel region dimension, pulsations in the pulsating pressure are dissipated such that a pressure at a location where the fluid is introduced to the ambient does not pulsate and such that turbulence is reduced below a first turbulence at the location where the fluid is introduced to the ambient pressure region, the first turbulence being for a channel region exit of the heat transfer system in the absence of the dissipation region, the turbulence corresponding to a more laminar flow than the first turbulence;
   wherein at least part of the dissipation region is formed by a spout coupled with the chamber, a portion of the spout extending over a portion the chamber and over a second portion of the channel region.

2. The method of claim 1, wherein the activating the active component further includes:
   driving the active component at a frequency corresponding to at least one of a fluidic resonance and a structural resonance of the active component.

3. The method of claim 1, wherein the dissipation region is coupled with the channel region such that at least one of the channel region or the dissipation region are tapered.

4. The method of claim 1, wherein a heat spreader is coupled with the chamber, the channel region being between the heat spreader and the chamber, at least a portion of the dissipation region being formed by a portion of the heat spreader.

5. The method of claim 1, wherein the dissipation region is formed by a spout coupled with chamber.

6. The method of claim 1, wherein the dissipation region has a length of at least two millimeters.

7. The method of claim 1, wherein a heat transfer system includes the chamber, active element, channel region, and dissipation region, wherein the heat transfer system is incorporated into a device having a device edge, the dissipation region having an exit at which the fluid is introduced to the ambient, the exit being within two millimeters of the device edge.

* * * * *